United States Patent
Grosjean et al.

(10) Patent No.: US 10,676,349 B1
(45) Date of Patent: Jun. 9, 2020

(54) MEMS RESONATOR

(71) Applicant: SiTime Corporation, Santa Clara, CA (US)

(72) Inventors: Charles I. Grosjean, Los Gatos, CA (US); Nicholas Miller, Sunnyvale, CA (US); Paul M. Hagelin, Saratoga, CA (US); Ginel C. Hill, Sunnyvale, CA (US); Joseph C. Doll, Mountain View, CA (US)

(73) Assignee: SiTime Corporation, Sunnyvale, CA (US)

( * ) Notice: Subject to any disclaimer, the term of this patent is extended or adjusted under 35 U.S.C. 154(b) by 0 days.

(21) Appl. No.: 15/676,890

(22) Filed: Aug. 14, 2017

Related U.S. Application Data

(60) Provisional application No. 62/396,816, filed on Sep. 19, 2016, provisional application No. 62/374,675, filed on Aug. 12, 2016.

(51) Int. Cl.
*B81C 1/00* (2006.01)
*H01L 41/27* (2013.01)
*H01L 27/20* (2006.01)

(52) U.S. Cl.
CPC ........ *B81C 1/00698* (2013.01); *H01L 27/20* (2013.01); *H01L 41/27* (2013.01); *B81C 1/00158* (2013.01); *B81C 2201/0171* (2013.01)

(58) Field of Classification Search
None
See application file for complete search history.

(56) References Cited

U.S. PATENT DOCUMENTS

| | | |
|---|---|---|
| 4,011,149 A | 3/1977 | Nozik |
| 4,143,393 A | 3/1979 | DiMaria et al. |
| 4,924,135 A | 5/1990 | Pinkahsov |
| 6,325,848 B1 | 12/2001 | Watanabe |
| 7,202,761 B2 | 4/2007 | Lutz et al. |
| 7,369,003 B2 | 5/2008 | Hagelin |
| 7,369,004 B2 | 5/2008 | Partridge et al. |
| 7,439,658 B2 | 10/2008 | Aratake |
| 7,443,258 B2 | 10/2008 | Hagelin |
| 7,446,619 B2 | 11/2008 | Partridge et al. |
| 7,446,620 B2 | 11/2008 | Partridge et al. |
| 7,545,228 B1 | 6/2009 | Lu et al. |
| 7,586,239 B1 | 9/2009 | Li et al. |
| 7,639,104 B1 | 12/2009 | Quevy et al. |
| 8,410,868 B2 | 4/2013 | Schoepf et al. |
| 8,558,643 B2 | 10/2013 | Prunnila et al. |

(Continued)

FOREIGN PATENT DOCUMENTS

| | | |
|---|---|---|
| WO | 2005025057 A2 | 3/2005 |
| WO | 2011042597 A1 | 4/2011 |
| WO | 2012110708 A1 | 8/2012 |

OTHER PUBLICATIONS

Bachelet et al., "Structural-energy calculations based on norm-conserving pseudopotentials and localized Gaussian orbitals", Physical Review B, vol. 24, No. 8, pp. 4745-4752, Oct. 1981.

(Continued)

*Primary Examiner* — Andres Munoz

(57) ABSTRACT

Multiple degenerately-doped silicon layers are implemented within resonant structures to control multiple orders of temperature coefficients of frequency.

22 Claims, 14 Drawing Sheets

(56) References Cited

U.S. PATENT DOCUMENTS

| | | | |
|---|---|---|---|
| 8,633,635 | B1 | 1/2014 | Pan |
| 8,786,166 | B2 | 7/2014 | Jaakkola et al. |
| 8,916,942 | B2 | 12/2014 | Pensala et al. |
| 9,071,226 | B2 | 6/2015 | Jaakkola et al. |
| 9,214,623 | B1 | 12/2015 | Thalmayr |
| 9,705,470 | B1 | 7/2017 | Doll et al. |
| 9,837,981 | B2 | 12/2017 | Jaakkola et al. |
| 2003/0184412 | A1 | 10/2003 | Gorrell |
| 2004/0173816 | A1* | 9/2004 | Saxler ............... H01L 27/20 257/195 |
| 2005/0195050 | A1 | 9/2005 | Lutz et al. |
| 2005/0242904 | A1 | 11/2005 | Lutz et al. |
| 2006/0261915 | A1 | 11/2006 | Lutz et al. |
| 2007/0120625 | A1 | 5/2007 | Larson et al. |
| 2007/0262831 | A1 | 11/2007 | Van Beek et al. |
| 2009/0153258 | A1 | 6/2009 | Lutz et al. |
| 2009/0158566 | A1 | 6/2009 | Hagelin et al. |
| 2010/0107736 | A1 | 5/2010 | Lu et al. |
| 2010/0127596 | A1 | 5/2010 | Ayazi et al. |
| 2010/0127798 | A1 | 5/2010 | Ayazi et al. |
| 2010/0327701 | A1 | 12/2010 | Grannen et al. |
| 2011/0266925 | A1 | 11/2011 | Ruby et al. |
| 2011/0305120 | A1 | 12/2011 | Hessler et al. |
| 2012/0013412 | A1 | 1/2012 | Winkler et al. |
| 2012/0050236 | A1* | 3/2012 | Lo ..................... H01P 1/2135 345/204 |
| 2012/0132003 | A1 | 5/2012 | Comi et al. |
| 2012/0230159 | A1 | 9/2012 | Hessler et al. |
| 2012/0286903 | A1 | 11/2012 | Prunnila et al. |
| 2013/0057115 | A1* | 3/2013 | Saito .................. H03H 3/02 310/366 |
| 2013/0106246 | A1 | 5/2013 | Raieszadeh et al. |
| 2013/0285676 | A1 | 10/2013 | Rahafrooz et al. |
| 2014/0077898 | A1 | 3/2014 | Pensala et al. |
| 2015/0154885 | A1 | 6/2015 | Livermore-Clifford et al. |
| 2015/0180449 | A1 | 6/2015 | Umeda et al. |
| 2016/0096763 | A1 | 4/2016 | Aimone et al. |
| 2016/0099702 | A1 | 4/2016 | Jaakkola et al. |
| 2016/0099703 | A1 | 4/2016 | Jaakkola et al. |
| 2016/0099704 | A1 | 4/2016 | Jaakkola et al. |
| 2016/0156332 | A1 | 6/2016 | Umeda |
| 2016/0197597 | A1 | 7/2016 | Yamada et al. |
| 2017/0093361 | A1 | 3/2017 | Grosjean et al. |
| 2017/0365774 | A1* | 12/2017 | Rothberg ............. B06B 1/06 |

OTHER PUBLICATIONS

Bruner et al., "Electronic Effect in the Elastic Constants of Germanium", Physical Review Letters, vol. 7, No. 2, pp. 55-56, Jul. 1961.

Cerdeira et al., "Effect of Carrier Concentration on the Raman Frequencies of Si and Ge", Physical Review B, vol. 5, No. 4, pp. 1440-1454, Feb. 1972.

Csavinszky et al., "Effect of Doping on the Elastic Constants of Silicon", Physical Review, vol. 132, No. 6, pp. 2434-2440 Dec. 1963.

ECN Magazine, "World's First MEMS Real Time Clock," Nov. 29, 2010, 4 pages.

EE Times, "Built-in MEMS resonators beat quartz," Nov. 30, 2010, 3 pages.

Einspruch et al., "Electronic Effect in the Elastic Constant C' of Silicon", Applied Physics Letters, vol. 2, No. 1, pp. 1-3, Jan. 1963.

European Patent Office, International Search Report and Written Opinion of International Searching Authority in International Application No. PCT/US2016/038275, dated Nov. 2, 2016, 19 pages.

Frangi, Attilio et al., "Interface dissipation in piezoelectric MEMS resonators: an experimental and numerical investigation," Sensors, 2013 IEEE, Nov. 3-6, 2013, Baltimore, MD, pp. 1-4, ISSN: 1930-0395.

Hall, "Electronic Effects in the Elastic Constraints of n-Type Silicon", Physical Review, vol. 161, No. 3, pp. 756-761, Sep. 1967.

Hammond et al., "Intertial Transducer Design for Manufacturability and Performance at Motorola," 12th International Conference on Transducers, Solid-State Sensors, Actuators and Microsystems, 2003, Piscataway, NJ, USA, IEEE, Jun. 8, 2003, pp. 85-90, vol. 1.

Hao, Zhili et al., "An analytical study on interfacial dissipation in piezoelectric rectangular block resonators with in-plane longitudinal-mode vibrations," available online Aug. 21, 2015, Elsevier Sensors and Actuators A 163 (2010), pp. 401-409.

Harrison, "Pseudopotential theory of covalent bonding", Physical Review B, vol. 14, No. 2, pp. 702-711, Jul. 1976.

Hopcroft et al., "What is the Young's Modulus of Silicon?", Journal of Microelectromechanical Systems, vol. 19, No. 2, pp. 229-238, Apr. 2010.

Hung, Li-Wen et al., "Capacitive-Piezoelectric Transducers for High-Q Micromechanical AlN Resonators," Journal of Microelectromechanical Systems, vol. 24, No. 2, Apr. 2015, pp. 458-473.

Jaakkola, Antti et al. Experimental Determination of the Temperature Dependency of the Elastic Constants of Degenerately Doped Silicon, 2013 Joint UFFC, EFTF and PFM Symposium, pp. 421-424, IEEE.

Kaajakari, "Silicon as an anisotropic mechanical material—a tutorial", http://www.kaajakarl.net/-ville/research/tutorials/tutorials.shtml, pp. 1-5.

Keyes, "Density of States of Degenerate n-Type Silicon from Elastic Constants", Solid State Communications, vol. 32, No. 2, pp. 179-180; 1979.

Keyes, "Elastic Properties of Diamond-Type Semiconductors", Journal of Applied Physics, vol. 33, No. 11, pp. 3371-3372, Nov. 1962.

Kim, "Electronic effect on the elastic constant C44 of n-type silicon", J. Appl. Phys., vol. 52, No. 5, pp. 3693-3695, May 1981.

Kourani, Ali et al., "A 76.8 MHz temperature compensated MEMS reference oscillator for wireless handsets," available online Apr. 20, 2015, Elsevier Microelectronics Journal 46 (2015), pp. 496-505.

Lee, Hyung Kyu et al., "Electrostatic Tuning to Achieve Higher Stability Microelectromechanical Composite Resonators," IEEE Journal of Microelectromechanical Systems, vol. 20, No. 6, Dec. 2011, pp. 1355-1365.

Matsuda, Satoru et al., "Correlation Between Propagation Loss and Silicon Dioxide Film Properties for Surface Acoustic Wave Devices," IEEE Transactions on Ultrasonics, Ferroelectrics, and Frequency Control, vol. 60, No. 5, May 2013, pp. 993-997.

McSkimin, "Measurement of Elastic Constants at Low Temperatures by Means of Ultrasonic Waves-Data for Silicon and Germanium Single Crystals, and for Fused Silica", Journal of Applied Physics, vol. 24, No. 8, pp. 988-997, Aug. 1953.

Melamud, Renata et al., "Temperature-Insensitive Composite Micromechanical Resonators," IEEE Journal of Microelectromechanical Systems, vol. 18, No. 6, Dec. 2009, pp. 1409-1419.

Nelson, Andrew et al., A 48 MHz, Hermetic, 0.48 mm2 Chip-Scale Packaged USB3.0 Oscillator Integrating an FBAR Resonator with CMOS Circuitry, 2011 IEEE International Ultrasonics Symposium Proceedings, pp. 1226-1229.

Pan et al. "Thin-Film Piezoelectric-on-Substrate Resonators with Q Enhancement and TCF Reduction," Micro Electro Mechanical Systems (MEMS), 2010 IEEE 23rd International Conference, Jan. 24-28, 2010, Wanchai, Hong Kong, pp. 727-730, ISSN: 1084-6999.

Pensala et al., "Temperature Compensation of Silicon MEMS Resonators by Heavy Doping", Ultrasonics Symposium (IUS), 2011 IEEE International, pp. 1952-1955, Oct. 2011.

Popa, Laura C. et al., "2DEG Electrodes for Piezoelectric Transduction of AlGaN/GaN MEMS Resonators," European Frequency and Time Forum & International Frequency Control Symposium (EFTF/IFC), 2013 Joint, Jul. 21-25, 2013, Prague, pp. 922-925, IEEE.

Pourkamali, Siavash; "High Frequency Capacitive Single Crystal Silicon Resonators and Coupled Resonator Systems," Dissertation at Georgia Institute of Technology; Dec. 2006.

Rodriguez et al., "Structural properties of tetrahedrally coordinated crystals from first-principles calculations of pressure and total energies" Physical Review B, vol. 31, No. 8, pp. 5327-5334, Apr. 1985.

Ruby, Rich, "Positioning FBAR Technology in the Frequency and Timing Domain," Frequency Control and the European Frequency

(56) References Cited

OTHER PUBLICATIONS and Time Forum (FCS), 2011 Joint Conference of the IEEE International, San Francisco, CA, May 2-5, 2011, pp. 1-10, ISBN 978-1-61284-111-3.

Samarao et al., "Temperature Compensation of Silicon Micromechanical Resonators Via Degenerate Doping," Electron Devices Meeting (IEDM), 2009 IEEE International, IEEE Piscataway, NJ, USA, Dec. 7, 2009, pp. 1-4.

Sanchez-Dehesa et al., "Self-consistent calculation of the internal strain parameter of silicon", Physical Review B, vol. 26, No. 10, pp. 5960-5962, Nov. 1982.

Seitner, Maximilian J. et al., "Damping of metallized bilayer nanomechanical resonators at room temperature," Sep. 22, 2014, University of Konstanz, Department of Physics, 78457 Konstanz, Germany, pp. 1-17.

Smith et al., "Reevaluation of the derivatives of the half order Fermi integrals", J. Appl. Phys., vol. 73, No. 11, pp. 7030-7034, Jun. 1993.

Van Camp et al. "First Principles Calculation of Ground State and Electronic Properties of C and Si", Physica Scripta, vol. 35, pp. 706-709; 1987.

Villanueva, L.G. et al., "Interface Losses in Multimaterial Resonators," MEMS 2014, San Francisco, CA, USA, Jan. 26-30, 2014, pp. 632-635, IEEE.

White, Jr. B.E. et al., "Internal Friction of Subnanometer a-SiO2 Films," The American Physical Society, Physical Review Letters, vol. 75, No. 24, Dec. 11, 1995, pp. 4437-4439.

Seth Boeshore, UCSB PhD thesis, "Aluminum Nitride Thin Films on Titanium: Piezoelectric Transduction on a Metal Substrate," Sep. 2006, 175 pages.

Lemettinen et al., "MOVPE growth of nitrogen- and aluminum-polar AlN on 4H-SiC," Journal of Crystal Growth, vol. 487, Apr. 1, 2018, pp. 50-56, (19 pages as attached).

R.D. Vispute et al., "Epitaxial growth of AlN thin films on silicon (111) substrates by pulsed laser deposition," Journal of Applied Physics (ISSN 0021-8979), vol. 77, No. 9, p. 4724-4728, May 1995, 5 pages.

\* cited by examiner

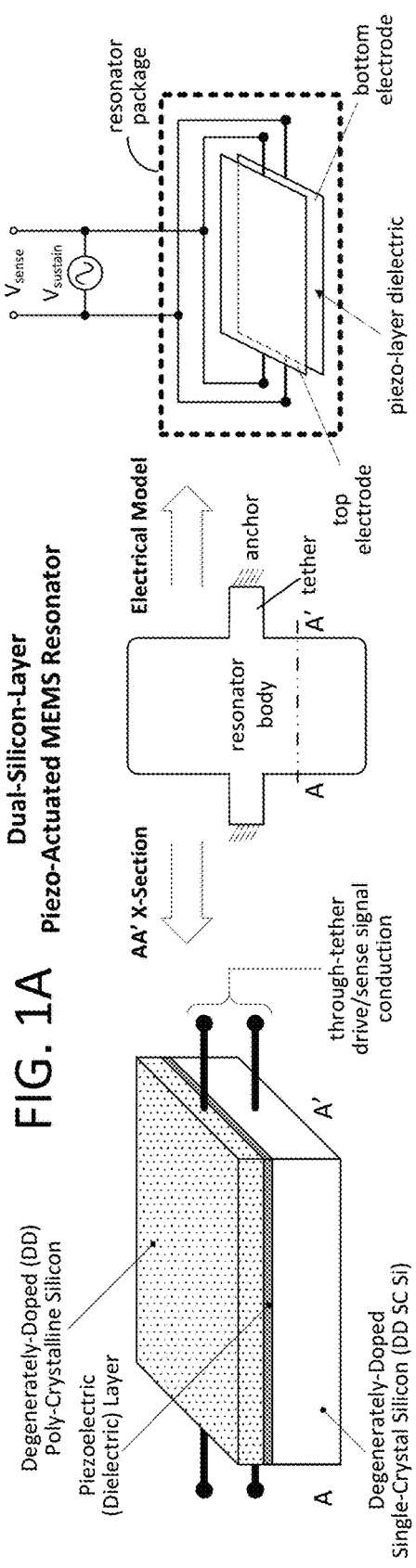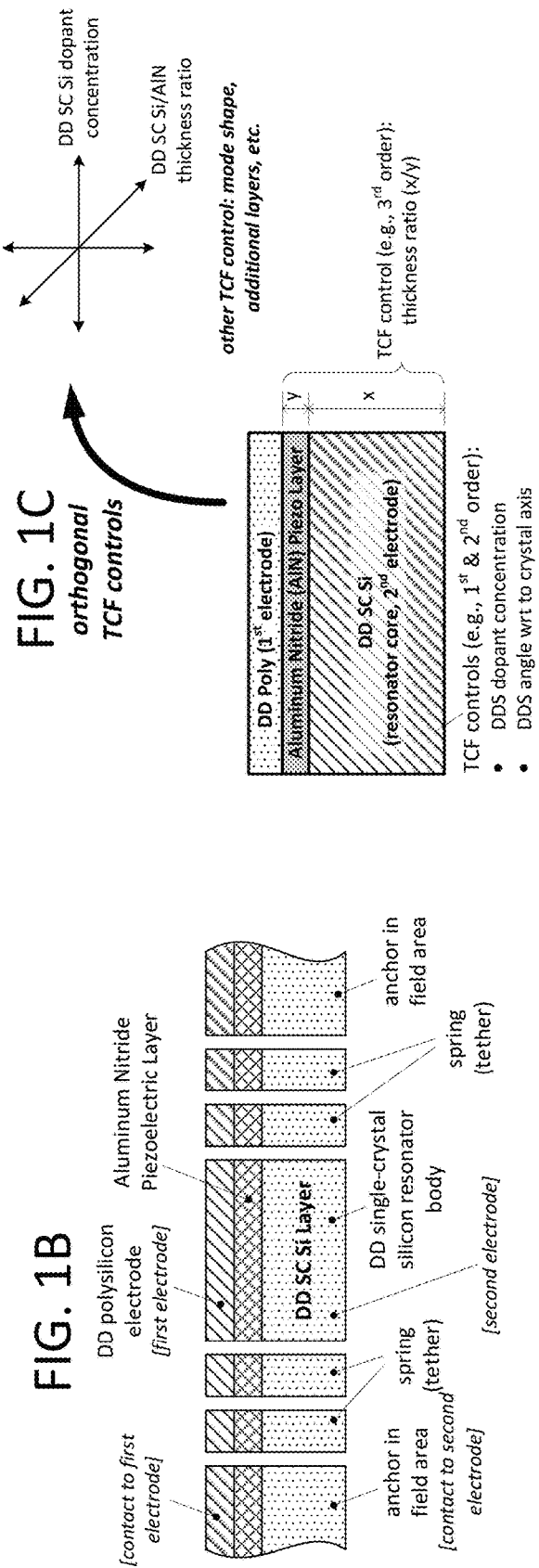

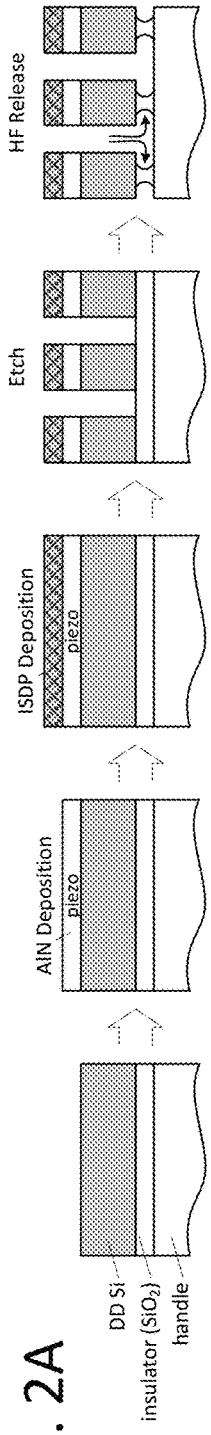
FIG. 2A
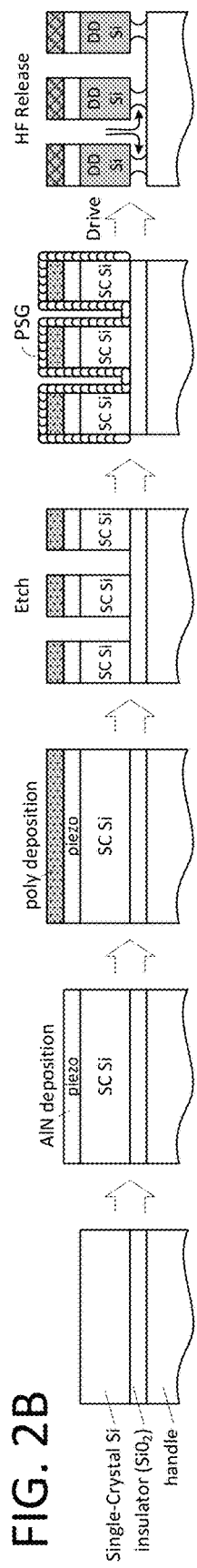
FIG. 2B
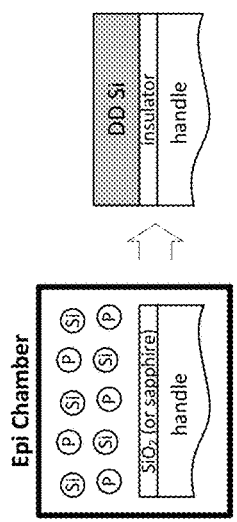
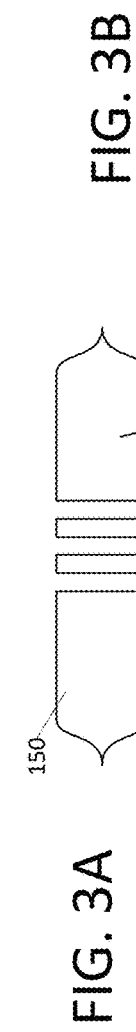
FIG. 3A
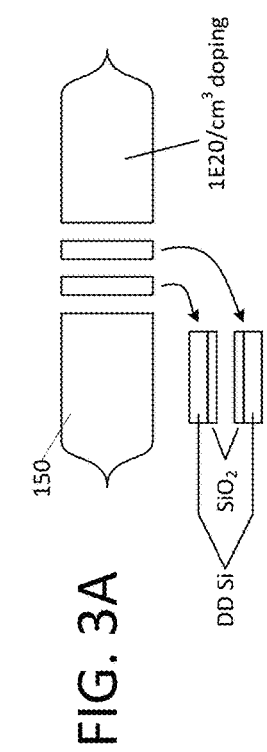
FIG. 3B
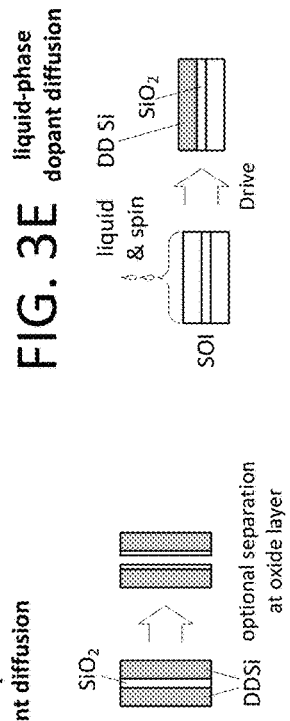
FIG. 3C solid-phase dopant diffusion
FIG. 3D vapor-phase dopant diffusion
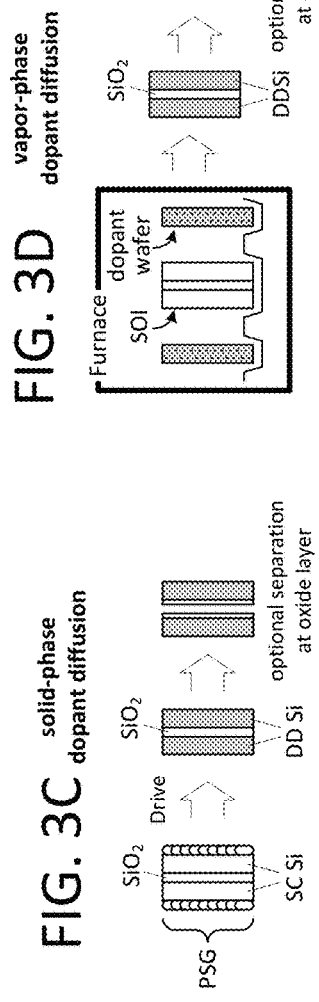
FIG. 3E liquid-phase dopant diffusion

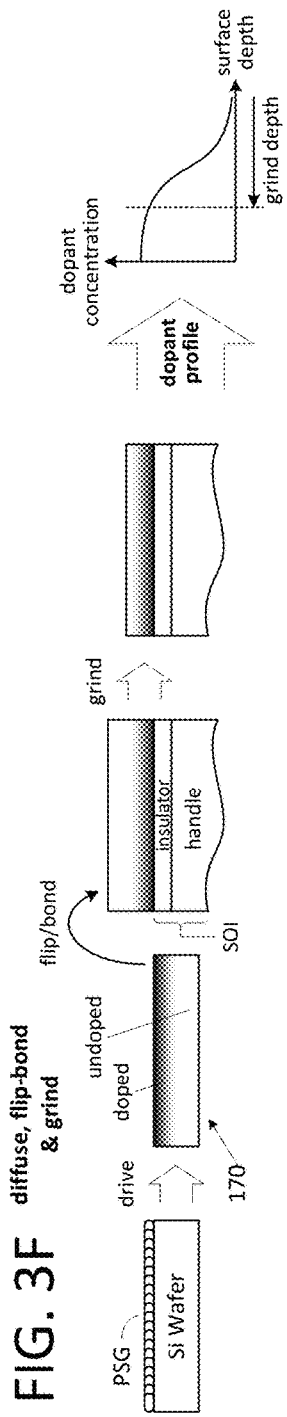
FIG. 3F diffuse, flip-bond & grind
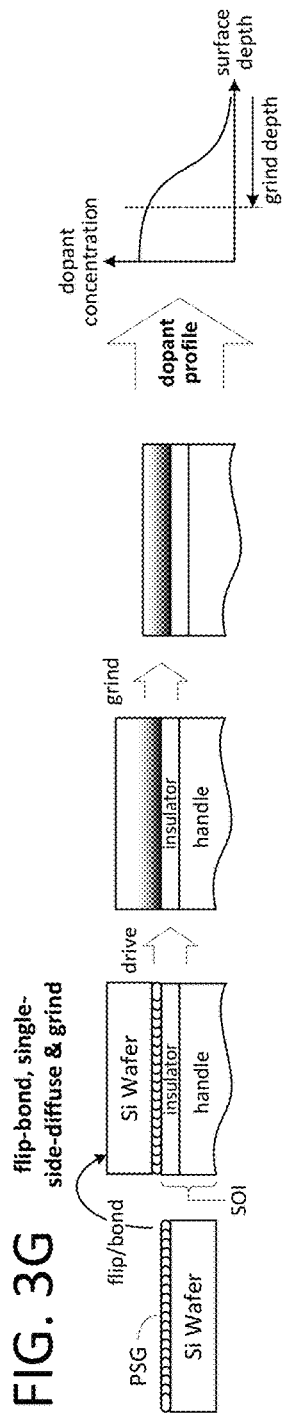
FIG. 3G flip-bond, single-side-diffuse & grind
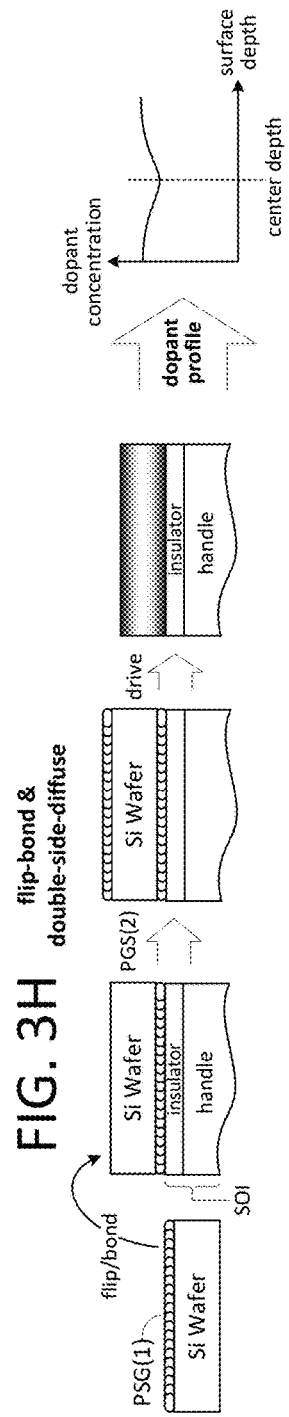
FIG. 3H flip-bond & double-side-diffuse
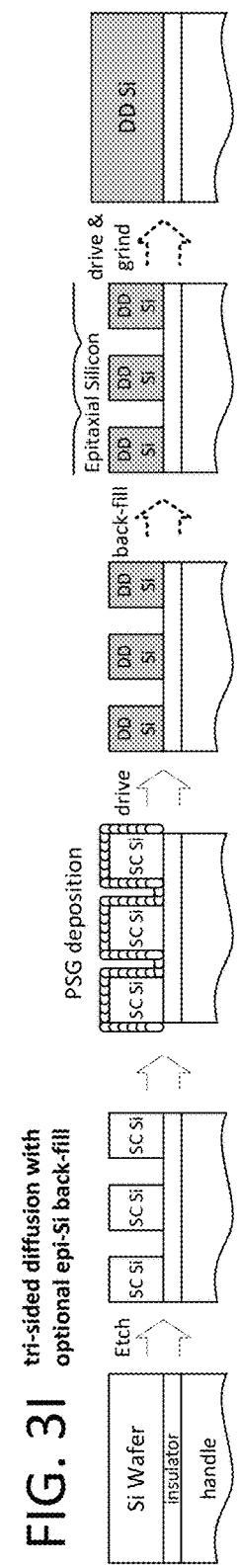
FIG. 3I tri-sided diffusion with optional epi-Si back-fill

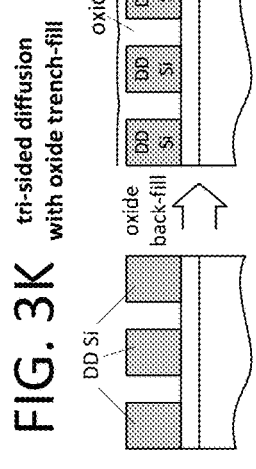
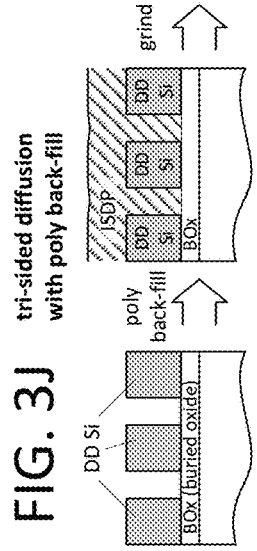
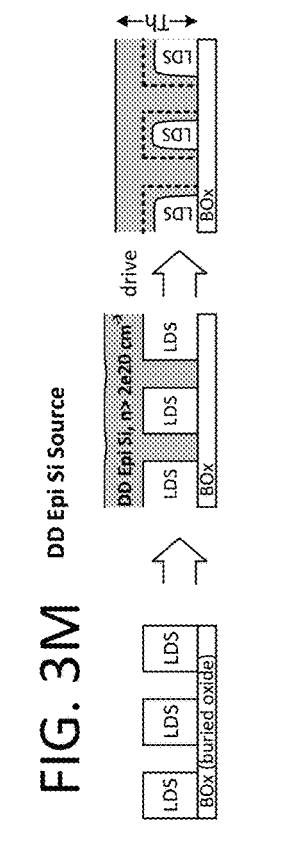
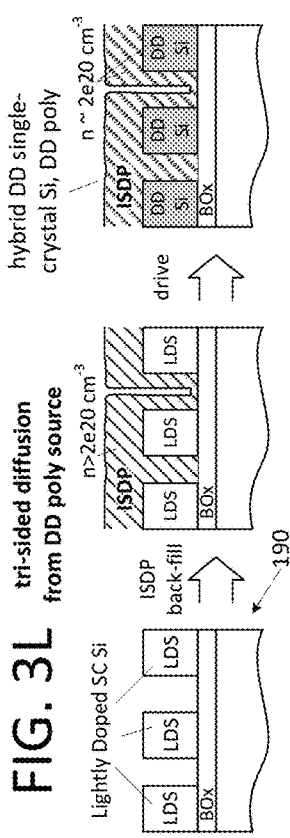
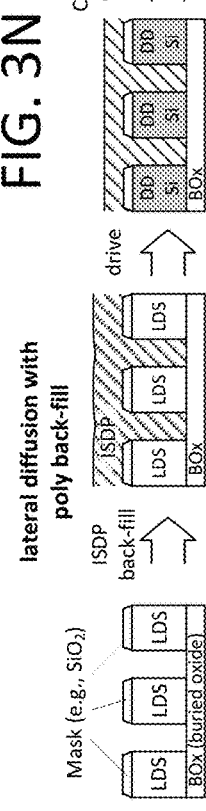
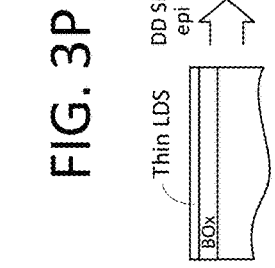
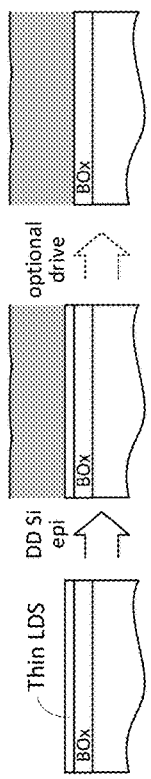
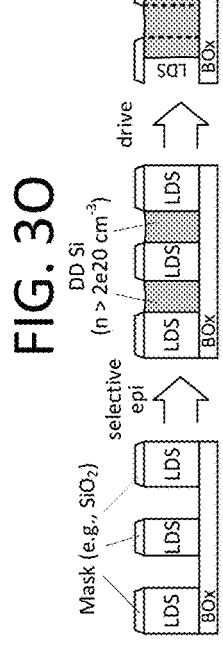
FIG. 3J  tri-sided diffusion with poly back-fill
FIG. 3K  tri-sided diffusion with oxide trench-fill
FIG. 3L  tri-sided diffusion from DD poly source
FIG. 3M  DD Epi Si Source
FIG. 3N  lateral diffusion with poly back-fill
FIG. 3O
FIG. 3P

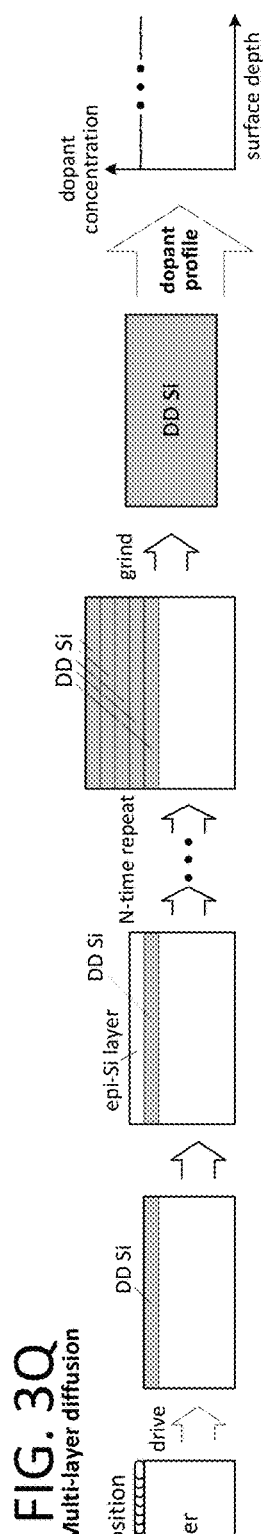
FIG. 3Q
Multi-layer diffusion
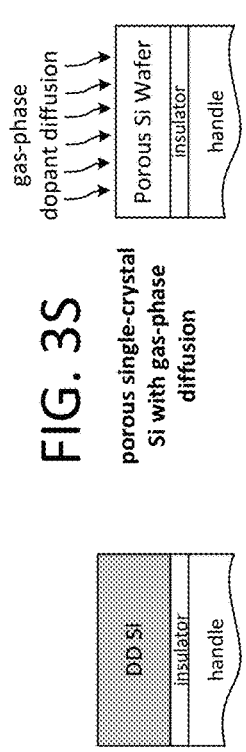
FIG. 3R
porous single-crystal Si with ion-implanted dopant
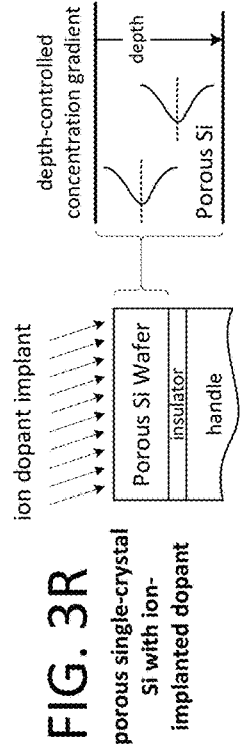
FIG. 3S
porous single-crystal Si with gas-phase diffusion
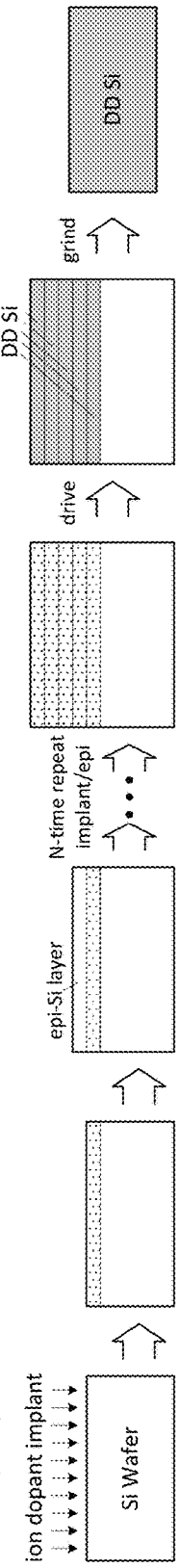
FIG. 3T Multi-layer implant
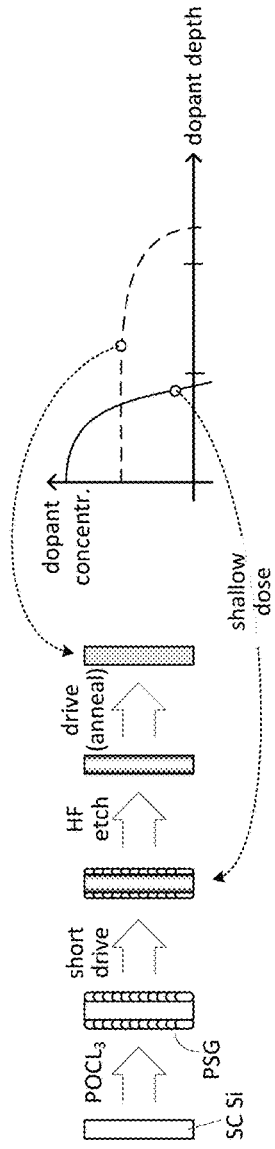
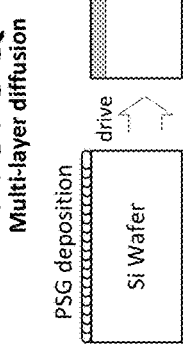
FIG. 3U

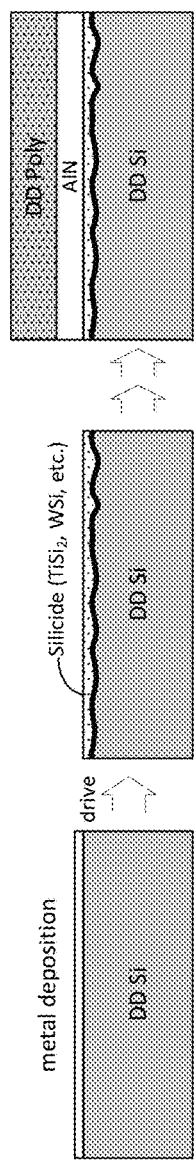
FIG. 4A
FIG. 4B
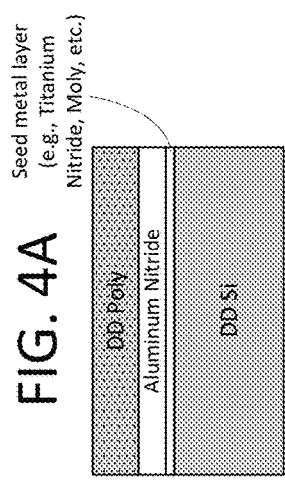
FIG. 5A
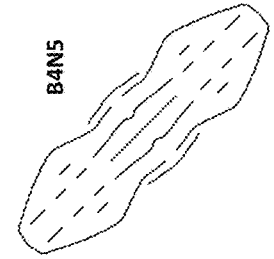
FIG. 5B
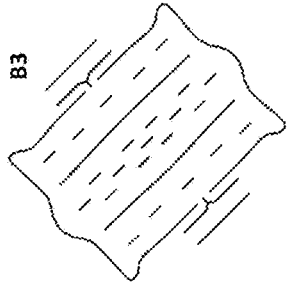
FIG. 5C
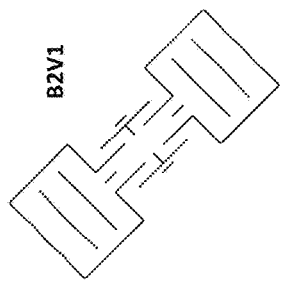
FIG. 5D
FIG. 5E
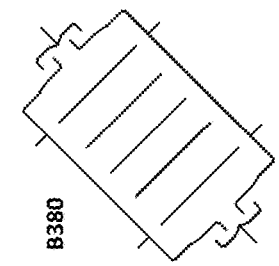
FIG. 5F
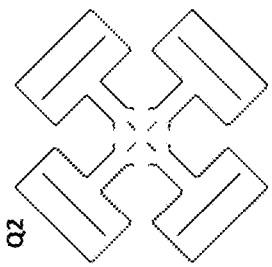
FIG. 5G
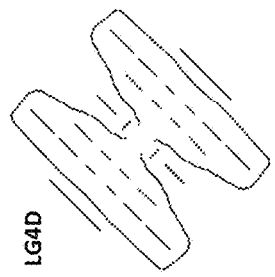
FIG. 5H
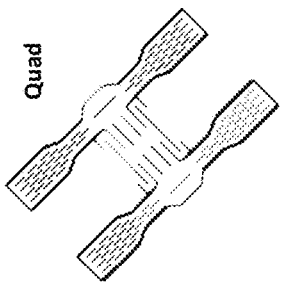
FIG. 5I
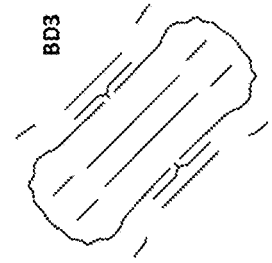

4-Stack with Outer Silicon Layers

4-Stack with Buried DD Poly Layer

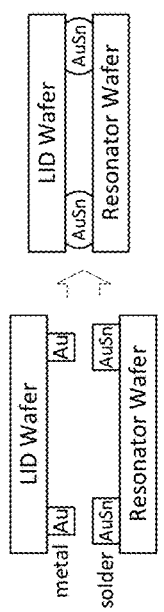
FIG. 8A
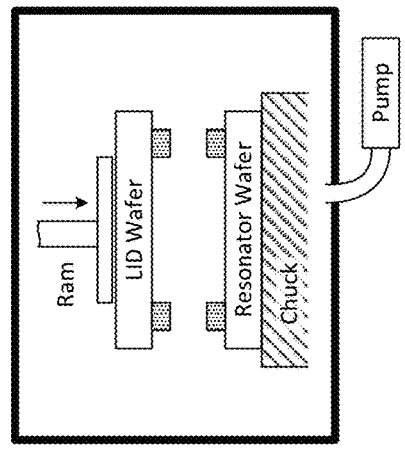
FIG. 8B
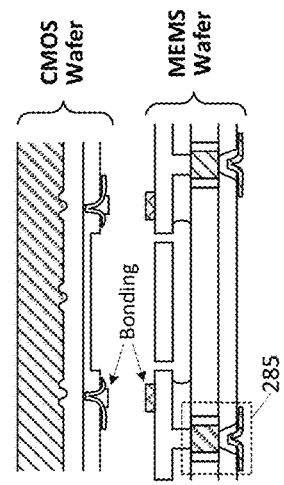
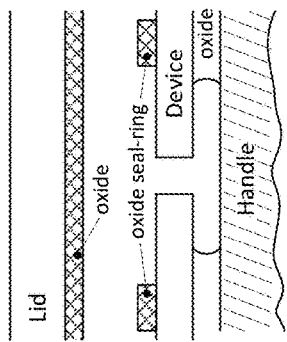
FIG. 8C TSV + Bond Surface
FIG. 8D TSV through lid after oxide-bonding or through substrate
FIG. 8E
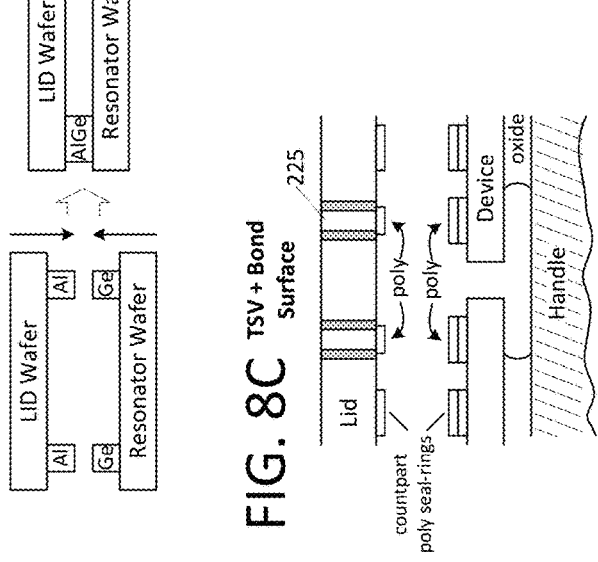
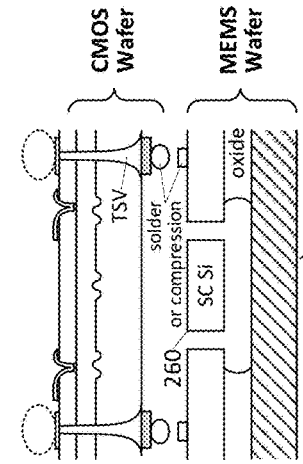
FIG. 8F
FIG. 8G
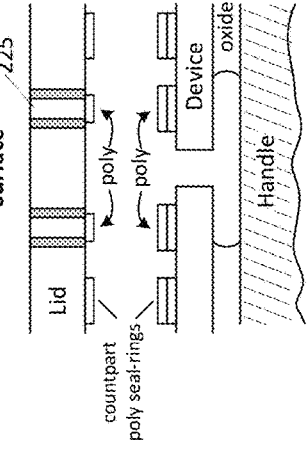
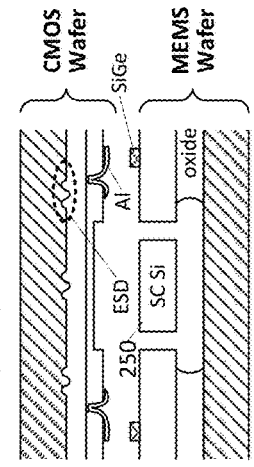
FIG. 8H

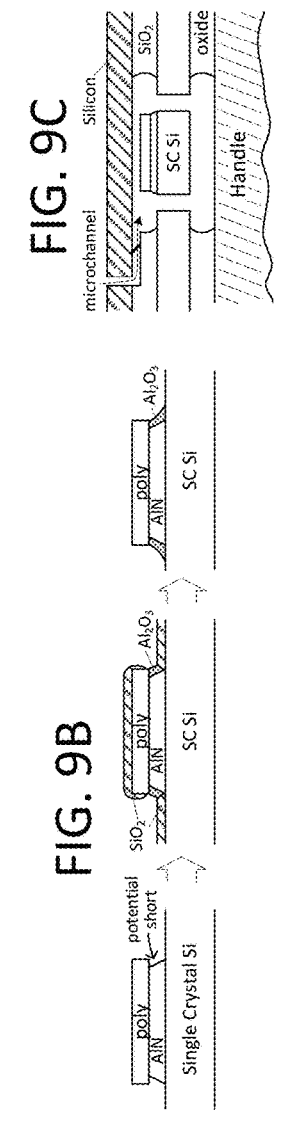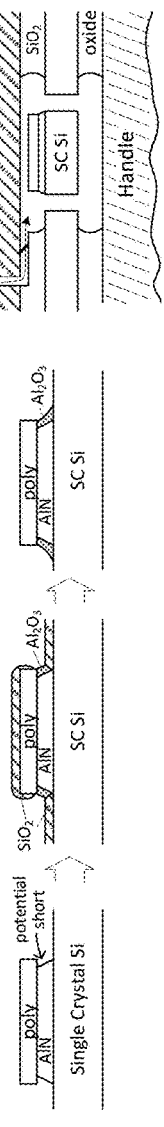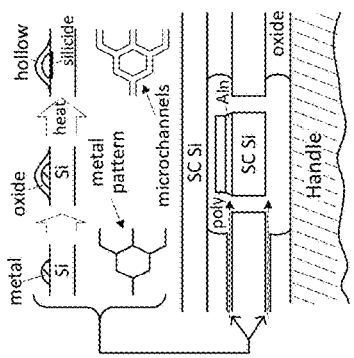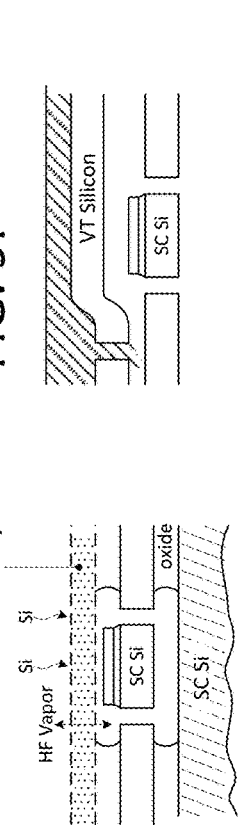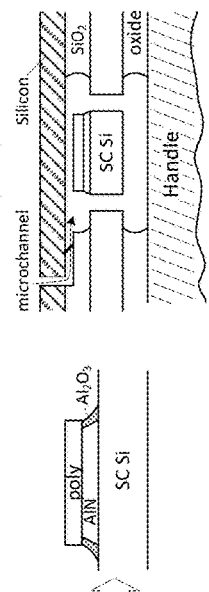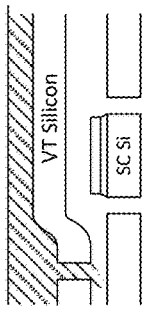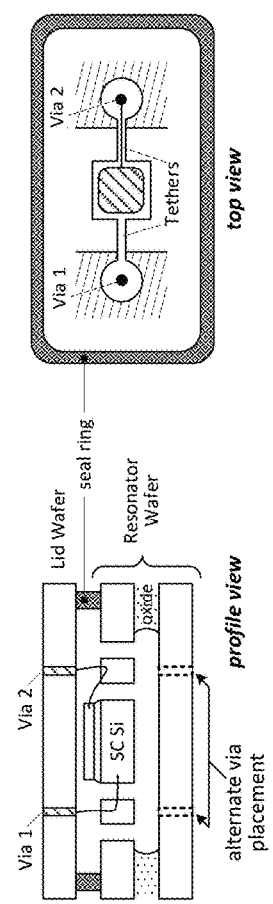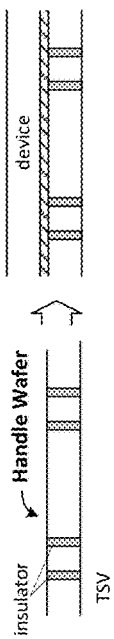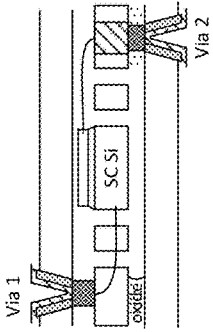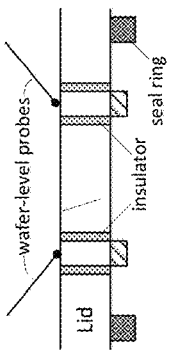

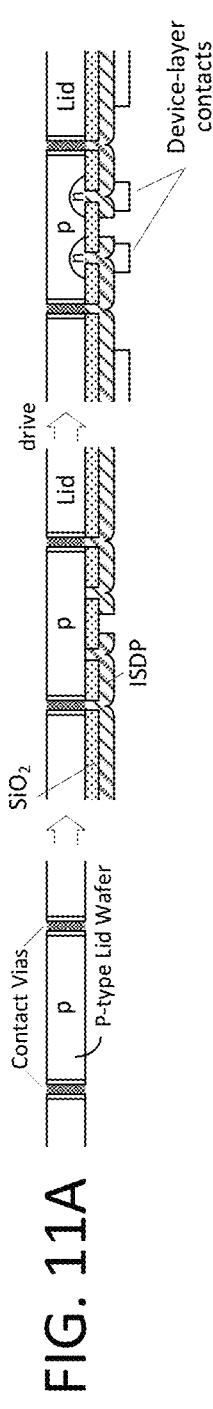
FIG. 11A
FIG. 11B
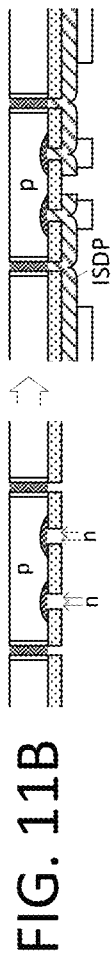
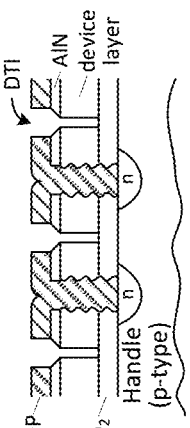
FIG. 11C
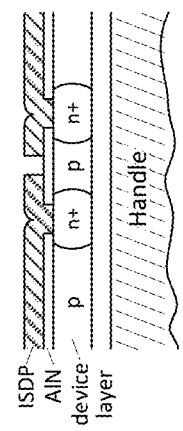
FIG. 11D
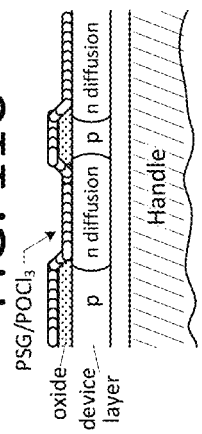
FIG. 11E

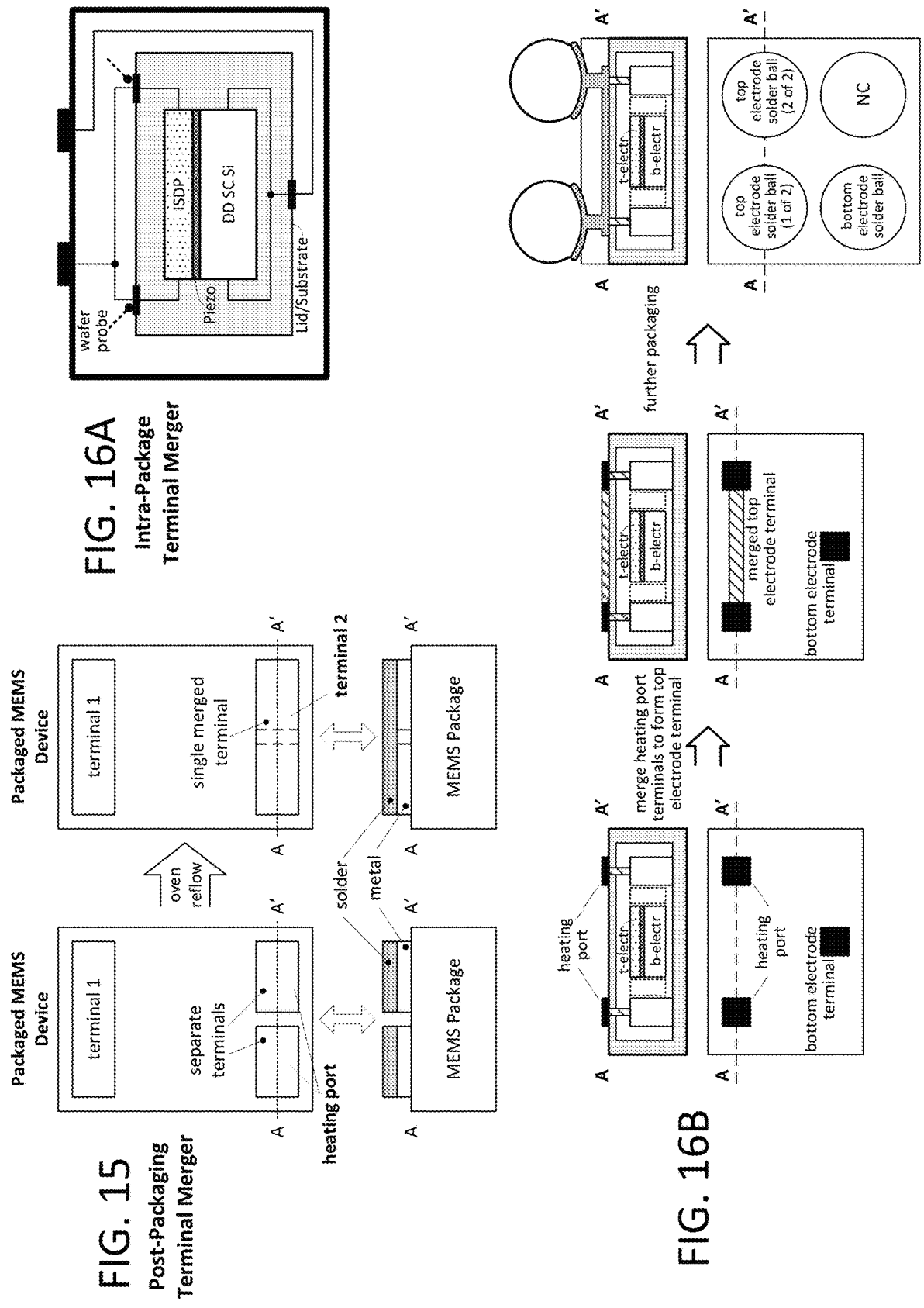

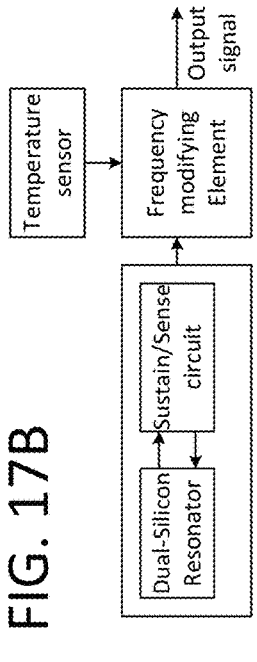
FIG. 17A
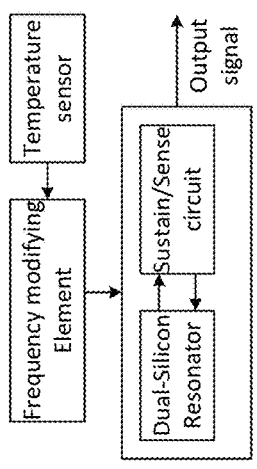
FIG. 18
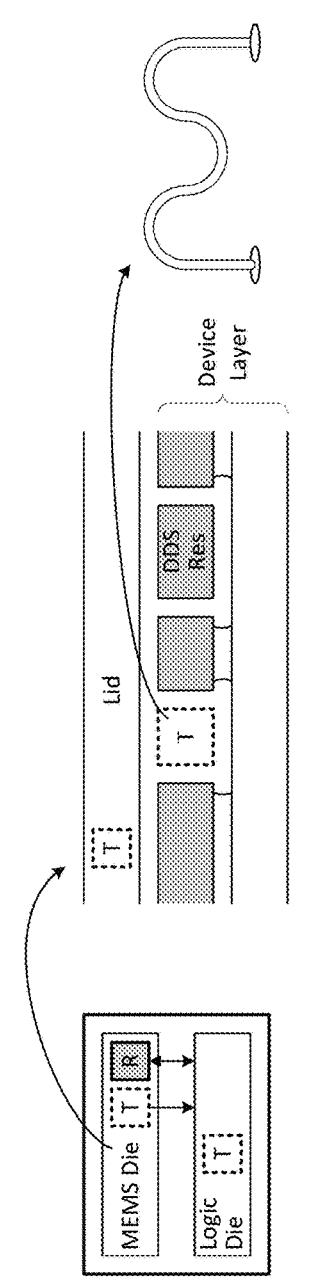
FIG. 17B
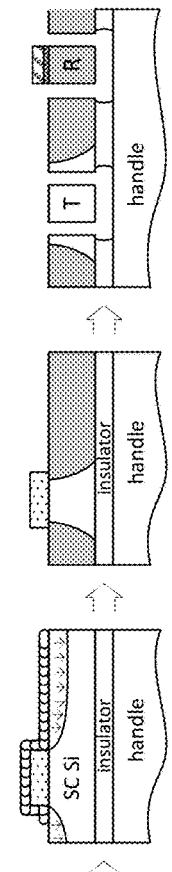
FIG. 19
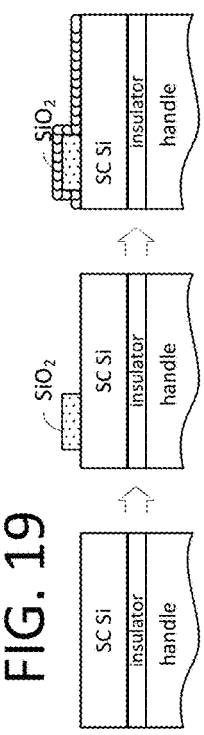
FIG. 20
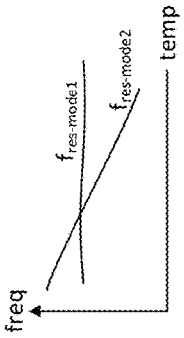
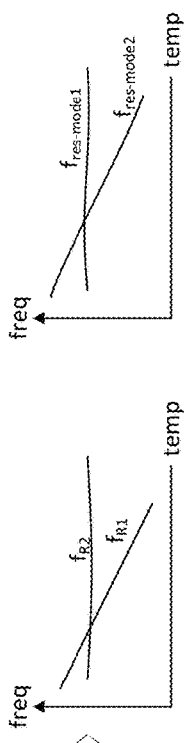
FIG. 21
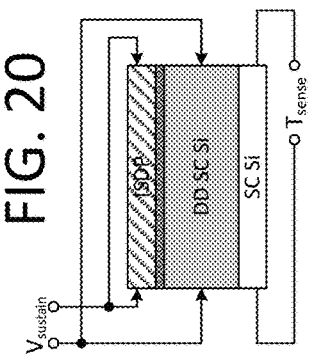
FIG. 22

MEMS RESONATOR

CROSS-REFERENCE TO RELATED APPLICATIONS

This application hereby incorporates each of the following U.S. Patent Applications by reference:

| Application Ser. No. | Filing Date | Title |
| --- | --- | --- |
| 61/937,601 | 9 Feb. 2014 | MEMS Resonator with Improved Control of Temperature Coefficients of Frequency |
| 14/617,753 | 9 Feb. 2015 | Temperature-Engineered Mems Resonator |
| 62/181,767 | 19 Jun. 2015 | MEMS Heating and Superheating |
| 62/183,689 | 23 Jun. 2015 | Temperature-Activated MEMS Frequency Trim |
| 15/186,510 | 19 Jun. 2016 | Microelectromechanical Resonator |
| 62/374,675 | 12 Aug. 2016 | MEMS Resonator |
| 62/396,816 | 19 Sep. 2016 | MEMS Resonator |

TECHNICAL FIELD

The disclosure herein relates to the field of microelectromechanical systems (MEMS) and more particularly to resonant MEMS structures.

BRIEF DESCRIPTION OF THE DRAWING

The various embodiments disclosed herein are illustrated by way of example, and not by way of limitation, in the figures of the accompanying drawings and in which like reference numerals refer to similar elements and in which:

FIGS. 1A-1C illustrate various physical, electrical and TCF-engineering aspects of an exemplary piezoelectrically-actuated MEMS resonator having at least two degenerately-doped silicon layers;

FIGS. 2A and 2B illustrate generalized alternative processes for fabricating the dual-silicon resonator depicted in FIG. 1B;

FIGS. 3A-3U illustrate alternative approaches to forming a degenerately-doped silicon layer or composite degenerately-doped silicon layer, generally but not necessarily on an insulator layer and handle wafer to form a degenerately-doped SOI structure as shown in FIG. 2A;

FIGS. 4A and 4B illustrate dual-silicon resonator embodiments having one or more metal layers or silicides to improve electrode conductivity and/or serve as seed beds to improve material structuring of an internal piezoelectric layer;

FIGS. 5A-5I illustrate non-exhaustive examples of dual-silicon resonator shapes and designs;

FIGS. 8A and 8B illustrate exemplary wafer-bonded resonator encapsulations formed by solder-bonding a lid wafer and device wafer;

FIG. 8C illustrates a generalized silicon bonding technique in which counterpart single-crystal silicon seal rings are fused, or a single-crystal silicon seal ring and polysilicon counterpart are fused, or counterpart polysilicon seal rings are fused;

FIG. 8D illustrates an oxide-based bonding approach in which an oxide layer (formed on the lid wafer is fused an oxide seal ring on the device-layer surface;

FIG. 8E illustrates an exemplary low-temperature wafer-bonding implemented within a vacuum chamber;

FIG. 8F illustrates a face-to-face wafer bonding approach in which a CMOS wafer is bonded to a MEMS wafer instead of a passive lid/cap wafer;

FIG. 8G also illustrates encapsulation of a MEMS feature using a CMOS wafer, but through bonding of a MEMS wafer face to a CMOS wafer backside;

FIG. 8H illustrates another face-to-face MEMS-to-CMOS wafer bonding approach, in this case with a TSV build into the MEMS wafer prior to bonding;

FIGS. 9A-9F illustrate various encapsulation strategies that do not require wafer-to-wafer bonding;

FIGS. 10A-10D illustrate various approaches for through-silicon-via (TSV) formation within an encapsulated (or to-be-encapsulated) dual-silicon layer MEMS resonator;

FIGS. 11A-11E illustrate various approaches for integrating electrostatic-discharge (ESD) protection devices within an encapsulated (or to-be-encapsulated) dual-silicon resonator;

diffusions, an ESD-protection circuit.

Figure 12A:
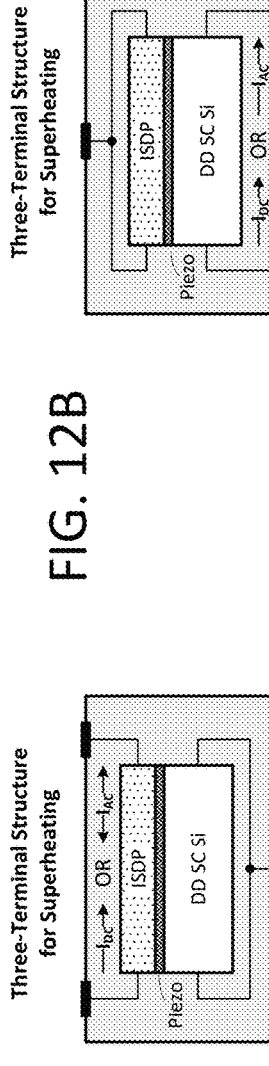
Figure 12B:
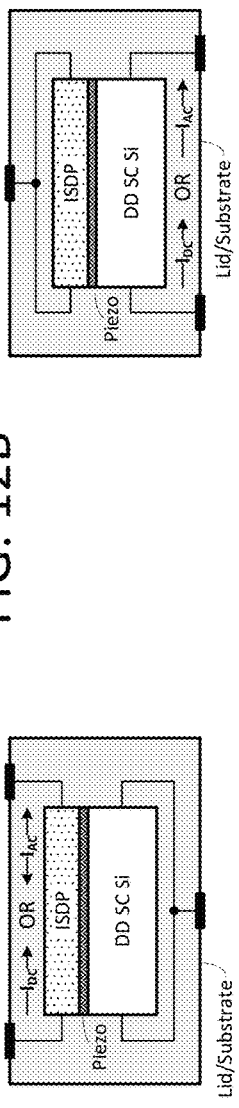
Figure 13A:
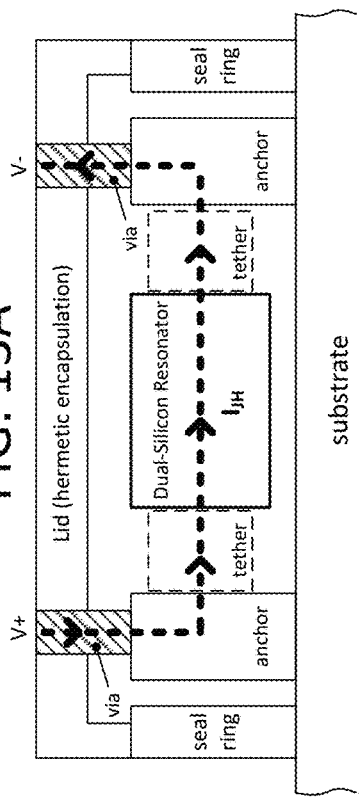
Figure 13B:
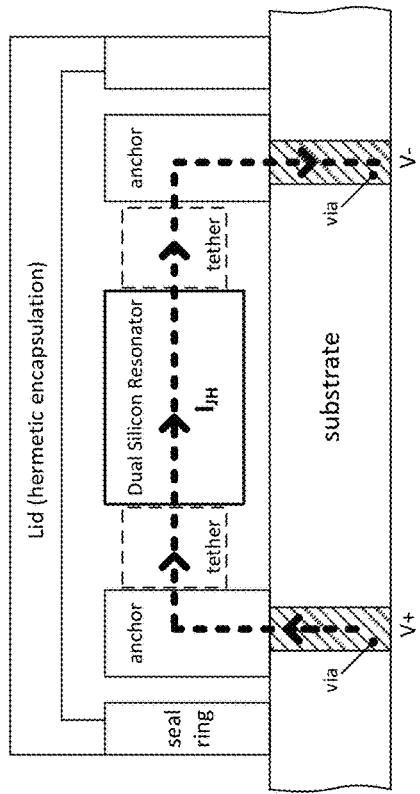
Figure 14A:
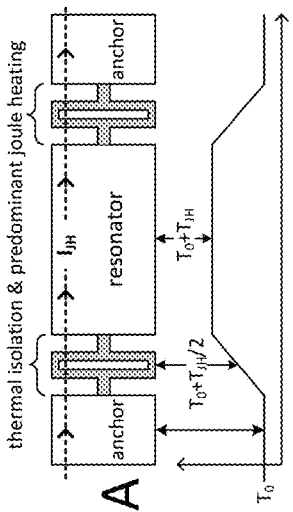
Figure 14B:
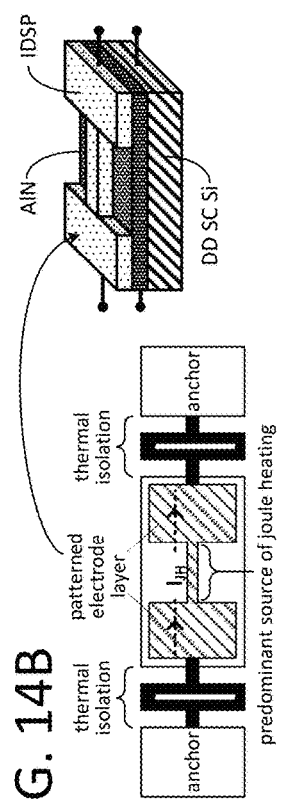

FIGS. 12A and 12B illustrate exemplary electrical interconnections between encapsulation-level TSVs and piezo-actuated resonator electrodes that enable both package-level terminal interconnection (i.e., during subsequent packaging steps) and post-encapsulation joule-heating of the MEMS resonator;

FIG. 13A illustrates a post-encapsulation joule-heating configuration in which electrically conductive vias extend through a hermetically encapsulating lid to contact corresponding electrically conductive anchoring structures;

FIG. 13B illustrates an alternative embodiment in which electrically conductive vias extend through the device substrate to enable joule-heating current flow through either or both of the resonator electrodes;

FIG. 14A illustrates an exemplary thermal profile achieved by conducting a DC or AC joule-heating current through a resonator structure via anchors and folded tethers;

FIG. 14B illustrates an alternative heating arrangement in which joule-heating is sourced primarily within a patterned electrode layer of the dual-silicon resonator;

FIG. 15 illustrates an exemplary processing of packaged dual-silicon-resonator MEMS device in which an oven reflow operation is executed to merge two separate terminals that form a joule-heating port into a single operational terminal;

FIGS. 16A and 16B illustrate an alternative terminal reduction approach in which three or more encapsulation-level terminals are merged prior to enclosure within a package housing to expose only two electrically independent package-level terminals;

FIG. 17A illustrates an exemplary oscillator system having a dual-silicon resonator in combination with a sustaining/sensing circuit;

FIG. 17B illustrates an alternative oscillator system embodiment in which the frequency of a dual-silicon resonator output signal is modified within an output processing stage;

FIG. 18 illustrates various options for integrating a temperature-sensor within an oscillator system having a dual-silicon resonator;

FIG. 19 illustrates an exemplary process for fabricating a MEMS thermistor and dual-silicon MEMS resonator within neighboring regions of the same SOI substrate;

FIG. 20 illustrates an exemplary interconnect arrangement within a dual-silicon resonator having an additional lightly-doped (or undoped) single-crystal silicon thermistor layer as part of the resonator structure;

FIG. 21 illustrates an alternative temperature-sensing embodiment that exploits an output frequency difference between a temperature-sensitive resonator and a relatively temperature-insensitive ("temperature-flat") dual-silicon resonator; and FIG. 22 illustrates an alternative temperature-sensing approach in which two simultaneous and disparate temperature-dependent resonance modes within a singular dual-silicon resonator are exploited to yield a temperature measurement.

DETAILED DESCRIPTION

Temperature-stable, wear-resistant resonators formed by material stacks having at least two degenerately-doped silicon layers and a piezoelectric material layer are disclosed in various embodiments herein. In a number of implementations, the piezoelectric material layer ("piezo layer") is sandwiched between a degenerately-doped single-crystal silicon "core" layer and a degenerately-doped polycrystalline layer, with those outer silicon layers serving as electrodes for conducting drive/sense signals to the piezo layer—obviating conventional metal electrode layers and their undesired aging properties (i.e., wear-hardening over time). Further, as described for example and without limitation in incorporated U.S. patent application No. 61/937,601 and Ser. No. 14/617,753, layer thickness ratios, crystallographic orientation of the single-crystal layer (at least), mode shaping and/or degenerate dopant concentration/type may be engineered to substantially zero at least the first-order (linear) and second-order (parabolic) temperature coefficients of frequency (TCFs) for the material stack as a whole, with the intrinsic parabolic TCF of the piezo layer, for example, being substantially canceled by a reverse-polarity parabolic TCF engineered within the degenerately-doped single-crystal silicon layer. Thus, in addition to the serving dual duty as both a sense/drive electrode and the resonator bulk layer, the degenerately-doped single-crystal silicon layer provides engineering "knobs" for yielding resonant MEMS structures having temperature-stable resonant frequencies (e.g., zero or near-zero combined TCF) over a desired operating temperature range (e.g., −45° C. to +85° C.). Similarly, the degenerately-doped polycrystalline silicon ("polysilicon" or "poly") layer serves as a wear-resistant electrode (and thus may be viewed, along with the piezo layer as part of the sense/drive component) and may also enable multiple degrees of TCF engineering. Moreover, both the poly layer and the single-crystal silicon layer enable thermal frequency trim operations as described for example and without limitation in incorporated U.S. patent application No. 62/183,689 and Ser. No. 15/186,510, permitting targeted, post-encapsulation and/or post-packaging adjustment of resonator frequency (e.g., adjusting natural frequency of wafer-scale or singulated resonators to within 10 ppm or less of a target output frequency). In other embodiments, piezoelectrically actuated, dual silicon-layer resonators are encapsulated with or without wafer-scale bonding, electrically completed according to various through-silicon-via arrangements, and fabricated with integrated electrostatic-discharge (ESD) protection circuits, any or all of which may leverage one or more component layers of the dual-silicon material stack. In yet other embodiments, one or more in situ temperature-sense elements (e.g., implemented within the resonator package, encapsulation chamber or even within the resonator structure itself), are provided to enable temperature-adjusted frequency-pull and/or post-resonator output frequency adjustment to further flatten the net resonator TCF (i.e., sum of $1^{st}$-order, $2^{nd}$-order, . . . , $n^{th}$-order TCFs) and/or compensate for aging affects or even permit run-time frequency adjustment (e.g., by enabling closed-loop heating to a desired operating temperature that leverages a $0^{th}$-order TCF).

FIGS. 1A-1C illustrate various physical, electrical and TCF-engineering aspects of an exemplary piezoelectrically-actuated MEMS resonator having at least two degenerately-doped silicon layers, referred to herein as a "dual-silicon" resonator. Referring first to FIG. 1A, the physical stack of materials shown in cross-section A-A' includes a degenerately-doped (DD) single-crystal silicon (SC Si) core, a piezoelectric layer (a dielectric), and a degenerately-doped polycrystalline silicon (DD poly) layer. Dopant concentrations within the outer silicon layers is sufficiently high (e.g., greater than $1E19/cm^3$) to effect low-loss electrical conductivity and thus enable the silicon layers to serve as electrodes for establishing a time-varying piezo-actuation voltage across the piezoelectric layer, obviating more conventional metal layers that tend to harden over time and undesirably shift the resonator frequency. In the particular embodiment shown, the top and bottom electrodes implemented by the poly and single-crystal silicon layers, respectively (with "top" and "bottom" referring arbitrarily to the drawing orientation as the structure may be flipped or otherwise reoriented in deployment), are electrically coupled to exterior package contacts through mechanical tether and anchoring structures to enable resonator reception of a piezo-actuating "drive" signal ($V_{sustain}$) and enable external sensing of a piezoelectric output signal ($V_{sense}$) indicative of mechanical motion of the resonant structure. As shown, the resonator material stack may be electrically modeled by a plate capacitance (the piezo electric layer) coupled to drive and sense nodes via low-loss conductive paths.

FIG. 1B illustrates an exemplary cross section through anchors, tethers and body of a more detailed dual-silicon piezo-actuated MEMS resonator. As shown, the piezoelectric layer is implemented by an aluminum nitride film (AlN) which extends, along with the two degenerately-doped silicon layers, through the tethers and anchors. Although depicted as disjointed elements, the tethers, anchors and resonator body are physically coupled to one another, with the tethers serving as spring-like structures to permit mechanical motion of the resonator (the "moveable micro-machined member") which is otherwise released from and suspended relative to the surrounding field areas. Accordingly, conductive paths may be formed through the anchors and tethers to generate an electrostatic potential across the aluminum nitride piezo layer and thereby actuate the resonator, causing oscillatory mechanical motion thereof in one or more mechanical resonance modes (e.g., extensional, breathe, lame, flexural, or any other practicable resonance mode). Various alternative materials may be used to implement the piezoelectric layer in the embodiment of FIG. 1B and all others disclosed herein including, for example and in isolation or any practicable combination, Zinc Oxide (ZnO), Lead Zirconate Titanate ($Pb[Zr_xTi_{1-x}]O_3$ $0 \le x \le 1$), Lithium Niobate ($LiNbO_3$), Gallium Nitride (GaN), Indium Nitride (InN), Scandium Aluminum Nitride (ScAlN), Quartz ($SiO_4$), etc.

With respect to TCF engineering, the degenerately-doped single crystal silicon layer incorporates at least two degrees of authority into a single layer: crystal orientation and dopant concentration. Additional authority is available with respect to deposition of the piezoelectric film on the highly doped single crystal silicon. In particular, the thickness ratio of the degenerately-doped single crystal silicon layer and an aluminum nitride piezoelectric layer ('x/y') may be selected/implemented to yield substantially matched, but opposite-sign second-order TCFs in those two layers, thereby canceling or substantially attenuating their combined parabolic contribution to the net resonator TCF, and also providing some control (authority) over the third-order resonator TCF. The preferred crystal orientation in the polysilicon film may also affect the first- and second-order TCFs. Accordingly, as shown in FIG. 1C, at least the first-order and second-order TCFs of the dual-silicon piezo-actuated resonator of FIGS. 1A and 1B can be engineered (controlled, manipulated) by varying the crystal orientation of the degenerately-doped single crystal silicon layer at a particular doping concentration, dopant type and layer thickness, the aluminum nitride layer thickness, and/or the degenerately-doped polysilicon layer thickness at a particular dopant concentration. In a number of embodiments, for example, the various TCF orders are engineered to yield a substantially zero net TCF (e.g., frequency within predetermined part-per-million (ppm) or part-per-billion (ppb) of target) over a desired operating range (e.g., −45° C. to 85° C.).

FIGS. 2A and 2B illustrate generalized alternative processes for fabricating the dual-silicon resonator depicted in FIG. 1B. In FIG. 2A, a degenerately-doped silicon layer ("DD Si") is formed over an insulating oxide (e.g., $SiO_2$), itself formed over a handling wafer "handle", thus forming a silicon-on-insulator (SOI) structure in which the top silicon layer is degenerately doped. After forming an aluminum nitride piezoelectric layer (i.e., grown, deposited, etc.) over the degenerately-doped silicon layer, a layer of in-situ-doped poly-silicon (ISDP) is deposited over the piezoelectric layer to complete the material stack. The stack is then etched to the oxide layer, forming isolation trenches that separate structural elements of the micromachined resonator system, followed by selective removal (e.g., through vapor-phase etching with hydrofluoric gas) of oxide-layer (insulator-layer) material to release the resonator element and at least portions of the tethering structures from the overall structure and thus render the resonator element moveable relative to the surrounding field area.

In FIG. 2B, process steps are reordered so that the piezoelectric layer (the "piezo layer") and an un-doped (or lightly doped) polysilicon layer are formed over a conventional SOI wafer (i.e., wafer in which the working silicon layer is not degenerately doped), and then etched to yield a structural arrangement similar to post-etch structure of FIG. 2A sans degenerately-doped silicon layers. Thereafter, a n-type dopant source is deposited over the upper and lateral surfaces of the trench-isolated structures—a dopant source shown in FIG. 2B as phosphosilicate glass (PSG), itself formed, for example, by exposure to vapor-phase phosphorous oxychloride ($POCl_3$). A thermal drive cycle is then carried out (heat and time) to diffuse the phosphorous dopant into the polysilicon and single-crystal silicon layers, followed by the same HF-release (or other structurally releasing etch of the insulator layer) as in FIG. 2A to finalize the structural arrangement.

While the material stacks shown in FIGS. 2A and 2B and embodiments below have/are generally described in terms of phosphoric degenerate doping, n-type dopants other than phosphorous may be used in alternative embodiments (e.g., arsenic, antimony, bismuth, lithium, etc.) and predominantly p-type dopants (e.g., boron, aluminum, nitrogen, gallium, indium, etc.) may be used instead of n-type dopants, with corresponding change in substrate type. Also, layer thicknesses depicted in FIGS. 2A and 2B and those discussed below are not necessarily to actual scale and may be disproportionate to actual scale. In a number of embodiments, for example, the thickness ratio of the degenerately-doped single-crystal silicon layer and aluminum nitride piezo layer is on the order of 30 to 1, though layer thicknesses that yield greater or lesser ratios may be used. The degenerately-doped polysilicon layer thickness may be chosen, for example, to achieve viable top-electrode formation and provide thermal frequency trim authority without disrupting the net TCF engineered within the piezo and degenerately-doped single-crystal silicon layers. In a number of embodiments, for instance, the degenerately-doped polysilicon layer thickness is roughly 25% of single-crystal silicon thickness, though layer thicknesses in greater or lesser ratios may be implemented. In a particular embodiment, the degenerately-doped single-crystal layer silicon layer is ~6 µm (microns) thick, the AN piezo layer thickness is ~0.2 µm and the degenerately-doped polysilicon layer thickness is ~1.6 µm, with those thickness ratios (~30:1:8) being approximately scaled (maintained) in taller or shorter material stacks. Any one or more of those material layers may be independently varied to achieve different thickness ratios. Also, as in all embodiments herein, in-situ-doped polycrystalline silicon (ISDP) may be used in place of degenerately-doped polycrystalline silicon or as a starting point for producing degenerately-doped polycrystalline silicon.

FIGS. 3A-3T illustrate alternative approaches to forming a degenerately-doped single-crystal silicon layer (or composite degenerately-doped silicon layer), generally on an insulator layer and handle wafer to form a degenerately-doped SOI structure as shown in FIG. 2A. In all cases, an insulator wafer or cavity wafer may be used as the starting substrate instead of an SOI.

FIG. 3A illustrates a degenerate-doping approach in which a single-crystal silicon ingot 150 is grown with a desired and substantially uniform dopant concentration, then sliced to yield degenerately-doped single-crystal wafers. Oxide deposition (on a surface of the degenerately-doped single-crystal silicon wafer—shown for example as $SiO_2$) and then bonding to a handle wafer (not shown) completes the degenerately-doped SOI formation. Although a $10^{20}/cm^3$ dopant concentration is depicted, concentrations may fall within the above-specified range according to application requirements.

FIG. 3B illustrates another approach for achieving a substantially uniform dopant profile (as opposed to the dopant concentration gradient that typically results in the diffusion-based approaches discussed below) in which a degenerately-doped single-crystal silicon layer is formed epitaxially over an insulator. In the particular example shown, a phosphorous-doped silicon layer is formed on an insulator (e.g., silicon dioxide, sapphire or other insulating layer) within an epi chamber—other dopant types may be used in alternative embodiments.

FIGS. 3C, 3D and 3E illustrate exemplary solid-phase, vapor-phase and liquid-phase dopant diffusion approaches, respectively, for fabricating a degenerately-doped SOI structure. In the solid-phase example of FIG. 3C, PSG is deposited on outer surfaces of a silicon-oxide-silicon structure to yield twin degenerately-doped single-crystal silicon layers separated by an oxide layer. Slicing through the oxide layer (an optional process step) produces identical degenerately-doped single-crystal silicon-on-insulator structures which may optionally be mounted on respective handle wafers.

In the vapor-phase dopant diffusion approach of FIG. 3D, dopant wafers are disposed adjacent respective surfaces of the single-crystal silicon sandwich shown in FIG. 3C (i.e., oxide sandwiched between outer single-crystal silicon layers), and then batch-heated in a furnace or oven to release vapor-phase dopant and diffuse the gaseous dopant into the single-crystal silicon layers of the structure. Slicing and optional handle-wafer bonding may be carried out thereafter as in the solid-phase diffusion example of FIG. 3C.

In the liquid-phase dopant diffusion example of FIG. 3E, a liquid-glass dopant is spun onto the surface of an undoped SOI structure, followed by a drive step to diffuse the dopant into the top single-crystal silicon layer. Although liquid-phase dopant application (and also vapor-phase and solid-phase) and diffusion is depicted with respect to a substantially planar single-crystal silicon surface, etching or other trenching operations may be carried out prior to dopant application in all cases to achieve multi-surface dopant diffusion (i.e., diffusing into the top and side-wall surfaces of the etched single-crystal silicon) and thus greater net dopant concentration within the single-crystal silicon layer. Examples of such tri-sided diffusion are discussed below.

As mentioned, the dopant diffusion approaches shown in FIGS. 3C-3E tend to exhibit dopant concentration gradients, for example, peaking at the surface of the doped layer and falling off rapidly at depths greater than ~2 microns unless extra measures are taken for an increased diffusion depth. FIGS. 3F-3L illustrate various approaches for diffusion-doping with increased net concentration and various different gradient profiles. In the embodiment of FIG. 3F, for example, a single-crystal silicon wafer is diffusion doped (solid-phase diffusion is depicted, though vapor-phase or liquid-phase diffusion are feasible in this and other cases discussed below) to yield a surface-peaked dopant gradient as shown at 170. Thereafter, the wafer is flipped and bonded to an oxide-coated handle wafer to form an SOI structure with a submerged degenerately-doped region (i.e., degenerately-doped region disposed adjacent insulator layer). The lesser-doped exposed single-crystal surface may then be ground or otherwise ablated to a desired depth to increase the net device-layer dopant concentration. As shown by the dopant profile, the greater the grind/ablation depth, the greater the net dopant concentration of the remaining silicon layer (i.e., as lower-concentration portions of the silicon layer are removed).

FIG. 3G illustrates a degenerate doping approach similar to that of FIG. 3F, but with the diffusion-drive executed after the flip-and-bond operation (i.e., diffusing in situ within the SOI material stack), and FIG. 3H builds on the approach of FIG. 3G by depositing a second layer of PSG following the flip-and-bond operation so that dopant is diffused into both surfaces of the subject silicon layer in the ensuing drive operation. As shown, the resulting dopant concentration profile in FIG. 3H is essentially a superposition of mirrored instances of the profiles shown in FIGS. 3F and 3G, having a relative minimum at a center depth of the degenerately-doped silicon layer. As can be appreciated, the center-depth concentration will vary according to pre-doping thickness of the single-crystal silicon layer, with the overall concentration profile tending toward uniformity as layer thickness is reduced.

FIG. 3I illustrates an alternative multi-surface dopant diffusion approach in which the single-crystal silicon core layer is etched prior to dopant deposition, thus exposing the silicon side walls such that the lateral gradient profile (i.e., from left-to-right across the trench-isolated single-silicon crystal structures) is similar to that shown in FIG. 3H, orthogonally overlaid with the single-surface-diffusion profile as shown in FIGS. 3F and 3G. As shown, the trenches may be back-filled with epitaxial silicon, followed by a drive step to diffuse the dopant into the now-silicon-filled trenches (i.e., over-doping in the initial diffusion-drive to effect a target net concentration on the subsequent backfill diffusion-drive). A grind/polish step may carried out after the back-fill diffusion to yield a finalized degenerately-doped SOI structure, ready for dual-silicon resonator fabrication.

FIG. 3J illustrates a tri-sided diffusion approach similar to that of FIG. 3I, except with degenerately-doped polysilicon back-fill (instead of undoped single-crystal silicon back-fill), thus obviating the second drive step and yielding a hybrid core-layer combination of degenerately-doped single-crystal silicon and degenerately-doped polysilicon. FIG. 3K illustrates yet another tri-sided diffusion approach, but with oxide back-fill instead of degenerately-doped silicon.

FIG. 3L illustrates another multi-lateral diffusion (tri-sided diffusion), in this case from a degenerately-doped polysilicon source. After etching trenches on an SOI or SOC wafer (i.e., to form lightly doped single-crystal silicon regions, "LDS" over a buried oxide layer, BOx, as shown at 190), highly doped polysilicon (ISDP over-doped to a concentration of greater than $2e20/cm^3$ in this example) is deposited to partially or completely fill the trenches, thus creating a degenerately-doped crystal/polysilicon material. The initial doping of the polysilicon film is substantially higher than the final doping concentration so that, after a drive cycle, dopant from the over-doped polysilicon diffuses into the LDS to form degenerately-doped single-crystal silicon (DD Si) together with polysilicon at a desired final doping concentration (e.g. ~$2e20$ $cm^{-3}$ in this example).

FIG. 3M illustrates an approach similar to that of FIG. 3L, but with over-doped degenerately-doped silicon ("DD Epi Si") epitaxially formed/grown over the trenched LDS (thus filling or at least partially filling the trenches and forming an overlayer) instead of DD poly deposition. During the subsequent drive cycle, dopant from the epi silicon diffuses into the LDS, shrinking the LDS cross section, potentially to zero, while the DD Si cross-section increases to a desired dopant concentration target.

FIGS. 3N and 3O illustrate lateral diffusion approaches in which a masking layer is formed (or left) over the top surface of the wafer prior to deployment of a dopant source. In the embodiment of FIG. 3N, ISDP is deposited and driven as in FIG. 3L, thus doping the LDS exclusively from the sides (i.e., mask layer prevents top-down diffusion). Accordingly, after CMP (or etch back or other planarization) and optional mask removal, a hybrid (potentially symmetric) structure remains, with alternating regions of DD Si and DD poly, each with a desired/target dopant concentration. In the embodiment of FIG. 3O, degenerately-doped silicon is epitaxially grown in the trenches (similarly to the approach of FIG. 3M, except that no substantial epi growth occurs on the oxide mask) and then driven to a degenerately-doped single-crystal silicon structure as shown.

FIG. 3P illustrates an alternative epitaxial approach in which a layer of degenerately-doped single crystal silicon is grown over thin LDS layer (which sits on the buried oxide). In one embodiment, the epitaxial degenerately-doped silicon ("DD Si epi") is doped above a target concentration so that a drive cycle (to diffuse dopant into the thin LDS layer)

merges the LDS and DD Si epi layers into a degenerately-doped silicon layer having a desired/target dopant concentration.

FIG. 3Q illustrates a multi-layer diffusion approach in which dopant-deposition, dopant-diffusion (drive) and epitaxial silicon layer growth processes are iteratively repeated to yield the composite dopant concentration profile shown. That is, the dopant deposition and diffusion operations are repeated for an initial single-crystal silicon layer and each new epitaxially formed single-crystal silicon surface layer, with the multi-layer structure being optionally ground as shown to yield a substantially uniform-dopant-concentration single-crystal silicon layer. Though solid-phase dopant deposition is depicted, liquid-phase or vapor-phase dopant deposition may be carried out in all or any one or more of the dopant deposition iterations. More specifically, where advantageous to do so, different dopant deposition operations (vapor, solid and/or liquid phase in any order) may be executed to effect the layer-by-layer production of degenerately-doped silicon.

FIGS. 3R, 3S and 3T illustrate alternative degenerate doping approaches in which dopant is implanted within the single-crystal silicon layer or diffused through a porous silicon layer to enable deeper degenerate dopant concentrations and/or depth-controlled concentration gradients (i.e., concentrations peaking at selected depths). In the embodiment of FIG. 3R, ion-beam dopant implant is followed by a thermal diffusion cycle to yield a degenerately-doped single-crystal silicon layer (e.g., as part of an SOI structure) which may be ground or otherwise ablated to remove lower-dopant-concentration surface regions. In the embodiment of FIG. 3S, vapor-phase dopant is diffused into a porous single-crystal silicon structure (followed by a thermal drive cycle) to achieve substantially deeper degenerately doped concentrations than with similar vapor-phase diffusion into non-porous silicon (i.e., as shown at 3D). Note that in either of the processes shown in FIGS. 3R and 3S a thermal cycle may be sufficient to render the porous silicon layer nonporous (i.e., melting the porous silicon) and/or high-temperature epitaxy or other process step may be carried out to transform the porous silicon layer to a nonporous silicon layer. FIG. 3T illustrates an approach similar to that of FIG. 3Q, but with repeated dopant implantation cycles instead of repeated dopant depositions. In other embodiments, dopant-implant and dopant-deposition cycles may be alternated to degenerately dope respective single-crystal silicon layers.

FIG. 3U illustrates a two-step doping process starting from a PSG film grown using POCl$_3$ (although other methods can be used for the initial doping as described generally in FIGS. 3A to 3T). Once the dopant film has been deposited on a silicon substrate, a short thermal drive transfers a shallow dose into the silicon. The dopant film is then removed from the wafer, in this example by HF etching of the PSG, and the dopant dose is redistributed or driven deeper during a subsequent longer thermal drive (i.e., anneal). This two-step doping approach has the advantage of separating the total dopant dose from the final desired distribution profile. More specifically, if the PSG dopant source was left in place for the entire long anneal, the source volume would play a greater role in the final dopant concentration and distribution, potentially resulting in less consistent concentration/distribution profiles. In addition, the two-step approach allows a relatively thin silicon dioxide layer to be used as a doping mask to create patterned undoped regions.

In each of the dual-silicon resonator embodiments described thus far, one or more metal layers or silicides may be introduced during layer-stack fabrication to improve electrode conductivity and/or serve as seed beds to improve material structuring of the piezoelectric layer (e.g., growing more ordered vertical grains of an aluminum nitride piezoelectric layer). FIG. 4A illustrates such an approach with a layer of titanium nitride, molybdenum (or any other practicable metal or silicide layers) formed over the degenerately-doped single-crystal silicon prior to piezo layer formation, with the top electrode implemented, as before, by a layer of highly doped polysilicon. FIG. 4B illustrates a similar approach in which a metal deposition (e.g., titanium, tungsten, etc.) over the degenerately-doped single-crystal silicon layer is thermally driven to form a silicide layer (e.g., TiSi$_2$, WSi, etc.) for improved piezoelectric layer formation and improved bottom electrode conductivity. Though not specifically shown, the layer stack shown in FIG. 4A may be re-ordered by reversing the positions of the degenerately-doped poly layer and metal layer. While such an arrangement may be susceptible to aging/work-hardening, top-electrode conductivity may be improved without sacrificing thermal frequency-trim authority afforded by the degenerately-doped polysilicon layer.

Despite depiction in rectangular cross section to this point, dual-silicon resonators disclosed herein may be implemented in various shapes and designs, each with features advantageous for particular use-cases, resonant modes and/or fabrication processes. FIGS. 5A-5I illustrate non-exhaustive examples of dual-silicon resonator shapes/designs, with each exemplary resonator implemented in the [110] crystallographic orientation (i.e., 45 degrees off-axis from the single-crystal silicon layer axis and/or predominant axis of the polysilicon layer, though various other angular orientations may be selected according to TCF engineering objectives). Referring first to the resonator shown in FIG. 5A, centrally-disposed bi-lateral tethers (springs) secure the otherwise freed resonator body to field-area anchors. The enlarged resonator end-masses tend to limit (restrict) modal interactions outside a desired resonant frequency over a frequency range of interest.

Referring to the resonators of FIGS. 5A-5I generally, resonant motion causes stress in selected directions across the resonator body in view of the in-plane anisotropic single crystal silicon core, particularly in the [110] axial orientations shown. Slots or vents (e.g., ~7 microns wide) are provided within the resonant body to provide stress relief and facilitate vapor-phase HF release—and also to enable lateral dopant diffusion in at least in some processes (e.g., as discussed above in reference to FIGS. 2B and 3I-3K) and/or effect TCF engineering. For example, in the resonators of FIGS. 5B and 5C (and others), the location and size of the slots are chosen to enhance dopant concentration in regions of high stress and, conversely, attenuate dopant concentration in low-stress regions. In the resonator designs of FIGS. 5D, 5E, 5F and 5G, vents in field areas (outside the resonator body) may be used to release those regions during vapor-phase HF etching, thus form cantilevers or other structures that suppress/avoid field-area interference with resonant behavior. The exemplary design in 5G includes a single centrally disposed anchor/tether from which release vents extend and tuned to limit transmission of vibration to the resonator bulk. The embodiments of FIGS. 5H and 5I illustrate centrally anchored resonators with more than two released members (or appendages) extending therefrom. The resonator of FIG. 5H, for example, resonates predominantly in extensional mode (with each of the point masses moving in-plane to and from the anchor), while the four beams extending outward from the central anchor in the FIG. 5I embodiment resonate in flexural mode (in effect, operating like a double-ended tuning fork). Various other resonator core shapes, anchoring schemes, appendage counts, angular orientations, etc. may be implemented in alternative embodiments, including embodiments that purposefully exhibit multiple simultaneous resonant modes (e.g., having different TCF characteristics as discussed below).

Figure 6A:
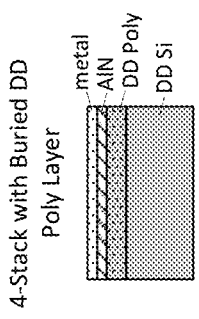
FIGS. 6A and 6B illustrate alternative material stacks having the three layers shown in FIG. 1A together with an additional metal layer.
Figure 6B:

FIGS. 6A and 6B illustrate alternative material stacks having the three layers shown in FIG. 1A (i.e., the two degenerately-doped silicon layers and piezoelectric layer) together with an additional metal layer. More specifically, in FIG. 6A, an additional metal layer is disposed between the degenerately-doped polysilicon layer and the piezo layer and serves, at least in part, to enhance conductivity of the top electrode. In one embodiment, for example, the metal layer serves exclusively as the top electrode for the piezo layer (e.g., with field-area via contact directly to the buried metal layer), in which case the degenerately-doped poly layer may serve primarily as authority for thermal frequency trim. In the embodiment of FIG. 6B, the degenerately-doped poly layer is relocated to the opposite side of the piezo layer (i.e., sandwiched between the piezo layer and core DD single-crystal silicon layer) thereby enhancing conductivity of the bottom electrode and maintaining the poly-layer thermal-trim authority. Though not specifically shown, an additional metal layer may also be disposed adjacent the bottom surface of the piezo layer (i.e., two metal layers sandwiching the piezo layer) to minimize conductive loss without sacrificing the TCF-engineering authority provided by the degenerately-doped single-crystal silicon core layer, or the thermal-trim authority provided by the degenerately-doped poly layer. Moreover, while the dual degenerately-doped silicon layers (single-crystal and polycrystalline silicon) are constituents of all material stacks described thus far, in all cases (including embodiments discussed below) either or both of those layers may be only lightly doped, undoped or even omitted altogether, for example, where their contribution to the resonator bulk, TCF-engineering, thermal-frequency-trim and/or other engineering or device-finishing authority is unneeded.

Figure 7A:
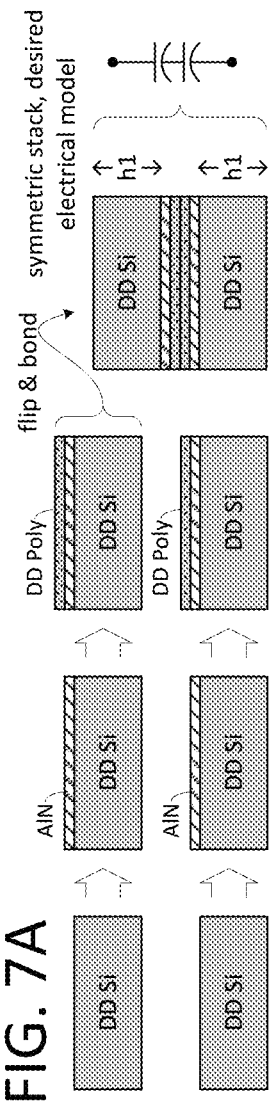
FIGS. 7A and 7B illustrate embodiments of symmetric dual-silicon material stacks that avoid surface-tension imbalance and resultant structural warping.
Figure 7B:
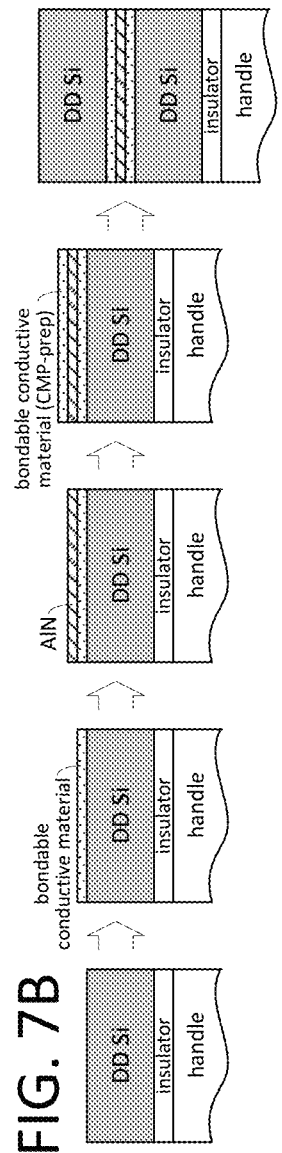

As discussed above, layer thicknesses within the dual-silicon resonator are generally non-uniform, and chosen, for example, to yield a desired TCF characteristic (e.g., with the core single-crystal silicon layer being 10 to 30 times the width of an aluminum nitride piezo layer) and bulk resonator size, aspect ratio or other dimension. Due to their differing coefficients of expansion and internal stresses, however, the material layers tend to warp when laminated into a composite stack, complicating downstream fabrication steps (and possibly producing unwanted modal characteristics or otherwise degrading runtime performance). FIGS. 7A and 7B illustrate embodiments of symmetric dual-silicon material stacks that avoid surface-tension imbalance (and resultant warping). In the embodiment of FIG. 7A, for example, two dual-silicon/piezo-layer material stacks are fabricated generally as described in reference to FIG. 2A, with one of the material stacks being flipped and bonded to the other, thus yielding a six-layer stack (or 5 layer if the bonded polysilicon layers are viewed as a single layer) having a line of symmetry at the bond surface. Thus, the relatively thick degenerately-doped single-crystal silicon core at the bottom of the stack is balanced by a same-height ("h1") degenerately-doped single-crystal silicon core at the top of the stack. Electrically, the stack may be viewed as a having a top and bottom electrode (formed by the counterpart degenerately-doped single-crystal silicon layers) with series-connected capacitors (the two piezoelectric material layers) coupled between those electrodes and coupled to each other through the bonded degenerately-doped polysilicon layers—a series-coupled pair of capacitors, electrically equivalent to a single capacitive element having twice the elemental capacitance. One advantage of this approach, in addition to stress balancing, is the relatively tall material stack profile that results from the twin single-crystal silicon (core resonator) layers—an arrangement that may meet large-profile design specifications (e.g., 12-20 micron resonator heights or more) without requiring undue process scaling or additional material layers.

FIG. 7B illustrates an alternative symmetric dual-silicon material stack in which a layer of bondable conductive material is formed between the core single-crystal silicon layer and the piezoelectric layer, followed by formation of another such layer over the piezo layer (sandwiching the piezo layer between two films of the bondable conductive material). After surface preparation (e.g., chemical-mechanical planarization), another instance of the core silicon layer is bonded to the material stack, thus forming (absent the bottom insulator and handle wafer) a substantially symmetric material stack having the same series-coupled capacitor electrical model as the material stack of FIG. 7A. In an alternative to the FIG. 7B embodiment, the piezoelectric layer may be sandwiched between non-conductive bonding layers.

In a number of embodiments, the various dual-silicon resonator structures described above are encapsulated within a hermetically sealed chamber between a lid wafer and the handle wafer of an SOI substrate, with a seal ring encircling the chamber and serving to bond the lid wafer to the SOI substrate. FIGS. 8A and 8B illustrate exemplary wafer-bonded resonator encapsulations formed by solder-bonding the lid wafer and device wafer (i.e., SOI substrate or other composite wafer arrangement, also referred to herein as the "resonator wafer"). In the embodiment of FIG. 8A, for example, an aluminum seal ring ("Al") is formed on the lid wafer and a counterpart germanium seal ring ("Ge") is formed on the resonator wafer (encircling the MEMS resonator structure) with the two seal rings heat-fused to form an aluminum-germanium solder-bond as shown (the respective dispositions of aluminum and germanium on the lid and resonator wafers may be reversed). In FIG. 8B, a similar approach is used, but with a gold seal-ring ("Au") being heat-fused to a gold-tin counterpart ("AuSn") to form a eutectic gold-tin solder bond. FIG. 8C illustrates a generalized silicon bonding technique in which counterpart single-crystal silicon seal rings are fused, or a single-crystal silicon seal ring and polysilicon counterpart are fused, or counterpart polysilicon seal rings are fused. In the latter case, specifically shown in FIG. 8C, additional poly-to-poly bonding interfaces may be provided to strengthen the wafer bond and also couple through-silicon-vias (TSVs) 225 in the lid to device contact points, thereby establishing electrical contact through the lid to the top and bottom electrodes of the dual-silicon material stack.

FIG. 8D illustrates an oxide-based bonding approach in which an oxide layer (e.g., $SiO_2$) formed on the lid wafer is fused an oxide seal ring on the device-layer surface. After oxide bonding, TSVs may be formed through the lid or SOI substrate as discussed in greater detail below. In yet other embodiments, low-temperature bonding may be implemented within a vacuum chamber as shown in FIG. 8E (e.g., within a background atmosphere of helium or hydrogen gas that can be diffused out), thus avoiding temperatures that may otherwise disrupt pre-fabricated elements of the resonator material stack. In the particular example shown, a ram and chuck arrangement is used pressure-fuse counterpart components of the seal ring.

FIG. 8F illustrates a face-to-face wafer bonding approach in which a CMOS wafer is bonded to the MEMS wafer instead of a passive or conventional lid/cap wafer. The CMOS wafer may incorporate complete and various integrated circuits (e.g., sustain/drive circuits, frequency synthesizer, temperature compensation in the case of a MEMS oscillator package, or any other circuit components useful in a chip package containing a MEMS die) or may be limited to electro-static discharge protection (ESD) circuits or other limited complementary MOS (metal oxide semiconductor) arrangement. In either case, the wafer bond may be implemented using aluminum pads and traces on the CMOS wafer with an appropriate counterpart material on the MEMS wafer. For example, a silicon-germanium (SiGe) alloy may be used on the MEMS wafer (i.e., to form an Al—SiGe bond) to allow higher temperature post-processing than elemental germanium (which may also or alternatively be used) or any other elemental or alloyed material or, more generally, any combination of MEMS-side and CMOS-side materials that enable creation of a stable hermetic bond, eutectic or otherwise). In one embodiment, for example, an aluminum-silicon alloy (AlSi—more generally, $Al_{1-x}$, $Si_x$ where x is generally greater than 1%) is disposed/patterned on either the CMOS wafer or the MEMS wafer, and germanium (or other material that will form a eutectic or otherwise sufficient bond with AlSi to hermetically seal MEMS feature 250) is disposed on the counterpart wafer. More generally, any of the bonding approaches shown herein may be used to bond any class of wafers including, for example and without limitation, bonding one MEMS wafer to another MEMS wafer. Note also that the aluminum-silicon alloy may be formed as part of the bonding process (e.g., first depositing a silicon film over an aluminum bond layer, followed by an initial thermal drive to produce the desired AlSi bonding alloy, then executing a second thermal drive under pressure to bond the AlSi pattern to the germanium counterpart and thus produce a AlSi—Ge wafer bond).

Liquidus temperatures >~430° C. can be achieved using a combination of aluminum, silicon, and germanium. One approach to achieve liquidus temperatures between 450° C. and 500° C. in materials that are commonly used and compatible with IC fabrication is to use an alloy of Al and Si (Si>1%) on one substrate corresponding with a second substrate with Ge. While such alloys are not commonly used, they are easily deposited using sputtering or other forms of physical vapor deposition. Another approach would be to make a stack of Silicon and Aluminum (distinct layers), and then melt them at the liquidus of Al—Si (~600° C.) prior to bonding at a lower temperature. This ternary system would have a eutectic temperature higher than that of Al—Ge, but lower than that of Al—Si.

FIG. 8G also illustrates encapsulation of a MEMS feature 260 (e.g., resonator or other microelectromechanical structure) using a CMOS wafer, but through bonding of a MEMS wafer face to a CMOS wafer backside. In such an embodiment, the CMOS wafer may be ground to its final thickness, have TSVs (through-silicon-vias) and backside metallization implemented in a bondable metal such that the backside of the CMOS (i.e., circuit-less side) face the MEMS feature cavity. As shown, a solder or compression bond may be used (e.g., including a eutectic bond achieved through heat and compression). As shown at 270, wafer bonding may be carried out such that multiple CMOS dies are bonded to a single MEMS die (e.g., hermetically sealing respective MEMS features implemented in the MEMS die) or, conversely, such that multiple MEMS dies are bonded to a single CMOS die.

FIG. 8H illustrates another face-to-face MEMS-to-CMOS wafer bonding approach, in this case with a TSV 285 built into the MEMS wafer prior to bonding. Under this approach, the CMOS wafer is bonded directly to the MEMS wafer with all (or a substantial portion of) package-level interconnects to the CMOS circuitry occurring through the MEMS wafer.

Figure 8I:
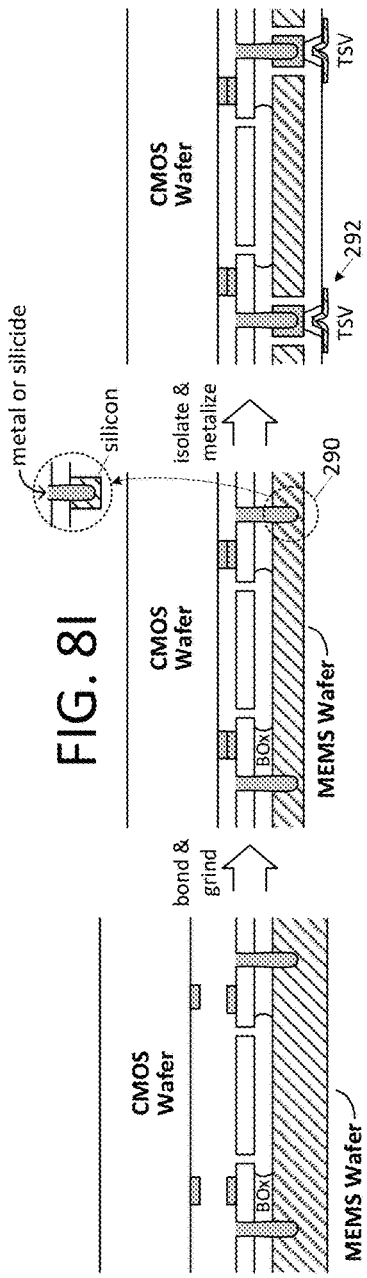
FIGS. 8I and 8J illustrates a two-phase (or multiple-phase) TSV implementation in connection with face-to-face MEMS-to-CMOS wafer bonding.
Figure 8J:
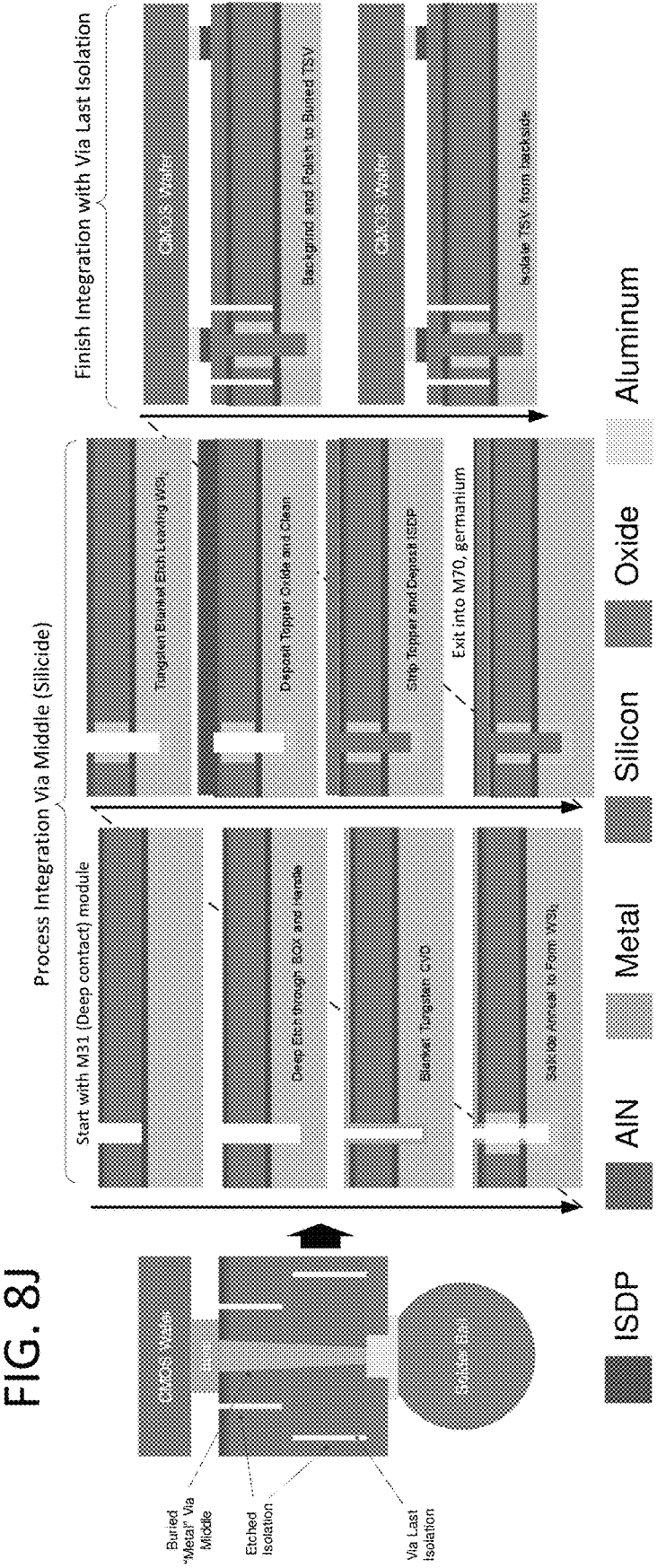

FIG. 8I illustrates a two-phase TSV implementation in connection with face-to-face MEMS-to-CMOS wafer bonding. In an initial phase, a portion of the TSV is implemented within the MEMS wafer, projecting, as shown at 290, through the device and buried-oxide layers into the handle layer, but not all the way through the handle layer. After bonding the CMOS wafer to the MEMS wafer, the MEMS wafer is backside-ground to its final thickness. Then, in a final (second) phase of the TSV implementation, a via structure 292 is formed at the MEMS wafer backside, projecting to a point of contact (within a trench-isolated region of the handle layer) with the initial-phase TSV portion to finish the end-to-end TSV. One advantage of the FIG. 8I (two-phase) TSV implementation is process/temperature compatibility with respect to the initial portion of the TSV. That is, the initial TSV portion can be fabricated using a high-temperature, pre-wafer-bond process (forming a blind metal via or silicide via) not generally possible after bonding. The TSV is finished in the second phase using the full-thickness CMOS wafer as a handle so that processing is straightforward, permitting the MEMS layer to be thinned considerably (e.g., to a thickness of 50 μm or less). FIG. 8J illustrates a more detailed view of an exemplary two-phase (or multi-phase) via implementation, with features/layers color-coded per the accompanying legend.

FIGS. 9A-9F illustrate various encapsulation strategies that do not require wafer-to-wafer bonding. More specifically, FIG. 9A shows the basic integration of an aluminum nitride piezoelectric stack with thin-film encapsulation. As aluminum nitride is a high temperature material, it is resistant to the temperatures of silicon epitaxy. However, the thin-film encapsulation process depends on the selectivity of epitaxial silicon growth to insulating layers. As the aluminum nitride film also serves as an insulator, the conditions of silicon growth need to be selective so that the upper poly-silicon electrode is not shorted to the underlying silicon by unintended growth on the aluminum nitride sidewall. Some selectivity can be gained in the aspect ratio and formation of the vents such that deposition preferentially occurs at the top of the vent while starving the resonator cavity of precursors. An alternative is to use silicon diffusion in high temperature hydrogen to collapse the vents so that the cavity is sealed and then a structural silicon layer can be grown on top of the thin sealed silicon layer.

FIG. 9B illustrates an alternative piezo-layer integration approach in which a thin, deposition-selective dielectric spacer (i.e., selective to silicon deposition during epitaxy) is formed on the exposed aluminum nitride surfaces ("potential short") prior to proceeding with thin-film encapsulation. In one embodiment, the silicon and aluminum nitride surfaces are oxidized forming silicon dioxide ($SiO_2$) and aluminum oxide (e.g., $Al_2O_3$) surfaces, respectively. The silicon dioxide can be removed at a higher rate than aluminum oxide using chemically selective and/or directional etches such as RIE (reactive ion etch) leaving a thin aluminum oxide sidewall dielectric spacer covering the aluminum nitride edges. Subsequently this structure can be sealed using silicon epitaxy. In an alternative embodiment, a silicon dioxide layer is deposited over the aluminum nitride and polysilicon stack, and then directionally etched to create a silicon dioxide spacer to serve the same purpose as the deposition-selective dielectric spacer.

FIGS. 9C and 9D illustrate formation of one or more microchannels at one of the silicon/silicon dioxide interfaces—hollow channels or tubes that allow the diffusion of HF gas for vapor etching of silicon dioxide. The microchannels can be formed using a variety of techniques such as pre-patterning a specific material such as a silicide forming metal, or producing a pattern of oxide/silicon interfaces and then exposing them to a high temperature so that they form hollow channels by shrinkage and gas-phase silicon dissolution, respectively. However formed, the microchannels can be buried in a subsequent deposition of oxide or silicon and later exposed through a strategic vent hole that is far from the resonator cavity. HF-vapor etching of silicon dioxide can be performed effectively through this network of microchannels as in thin-film encapsulation, but sealing is simplified because the vents that are filled are far from the cavity, and the microchannels are sealed almost immediately. The microchannels can also be sealed using rapid silicon diffusion in hydrogen gas; an approach that avoids exposing the structures in the cavity to traditional epitaxy precursors such as silane, dichlorosilane, and chlorine gas. In an alternative embodiment, the microchannels are sealed using a chemical vapor deposition process other than epitaxy, for instance low pressure or plasma enhanced CVD of oxide, silicon, nitride, or tungsten. Because individual microchannels are formed in an orientation orthogonal to the primary vent opening (hole), it is difficult to transfer such reactive precursors to the resonator cavity. In this latter case, most of the structural integrity is provided by a thick vent layer film, so that sealing is relatively thin—this in contrast to the traditional layer stack thicknesses for thin-film encapsulation approaches in which the vent layer is substantially thinner than the seal layer. Because the microchannel is formed first, the lateral (planar) dimension of the vent hole and the thin-film encapsulation layer thickness be varied relative to one another without conventional constraints.

FIG. 9E illustrates a vent layer implemented by a porous film (of relatively uniform porosity) rather than a solid film with discrete vent holes. In general, the porous film enables high diffusivity of HF vapor and low transport of silicon-based precursors at high temperature. The porous film layer can be formed from a traditional porous silicon film, a polysilicon film that is sufficiently thin or has been engineered to have some chemical attack at the grain boundaries, for instance by doping, or a film grown with intentional nanoscale defects that can be opened up with a subsequent etch or thermal process. In any case, after removing the sacrificial oxide (e.g., using vapor HF), the film can be sealed through various methods such as silicon epitaxy (classic thin-film encapsulation) or other deposited films such as LPCVD or PECVD oxides or polysilicon.

FIG. 9F shows an alternate structure in which vent holes are formed over a region having a very thin underlying sacrificial oxide—sufficiently thin that, after HF vapor etching, a microchannel region connecting taller cavities is formed. The subsequent epitaxy seals the thin channel quickly to prevent significant precursor intrusion (transport) into the cavity. Same or similar features can also be used for LPCVD or PECVD sealing with oxide or polysilicon.

FIGS. 10A-10D illustrate various approaches for through-silicon-via (TSV) formation within an encapsulated (or to-be-encapsulated) dual-silicon layer MEMS resonator. In the embodiment of FIG. 10A, for example, vias ("Via 1," "Via 2") formed through insulated passages in the lid are bonded to field-area conductive layers which extend, for example, through the tethers to bottom and top electrodes within the resonator material stack. TSVs may alternatively (or additionally) formed through the handle wafer (i.e., bottom wafer in SOI substrate) and routed to the field-area conductive structures.

FIG. 10B illustrates a more detailed example of lid-based TSV formation (showing in cross-section the insulated orifice and conductive TSV extending through the orifice) within the perimeter of wafer-bonding seal ring. As shown, wafer-level probes may be used to confirm contact integrity and carry out operational testing and/or other pre-singulation operations (e.g., joule heating and thus thermal frequency trim).

FIG. 10C presents a more detailed example of through-substrate via formation, with TSVs formed within insulated openings in the handle wafer and extending at least to the oxide (insulator) layer. Thereafter, etched regions are of the single-crystal silicon layer (device layer) and oxide layer are fill are filled with conductive material (e.g., ISDP or metal) to form an electrically continuous path through the SOI structure, or at least sufficiently through the SOI structure to make contact with laterally extending conduction paths to the top and bottom resonator electrodes. As in the through-lid TSV arrangement of FIG. 10B, wafer probes may be used to confirm contact integrity and carry out operational testing and/or other pre-singulation operations.

FIG. 10D illustrates a hybrid via arrangement, with one or more TSVs extending through the lid (e.g., as shown in FIGS. 10A and 10B) and one or more other TSVs extending through the substrate (as shown in FIG. 10C).

FIGS. 11A-11E illustrate various approaches for integrating electrostatic-discharge (ESD) protection devices within an encapsulated (or to-be-encapsulated) dual-silicon resonator. In the embodiment of FIG. 11A, an oxide mask layer (e.g., $SiO_2$) is formed over a TSV-penetrated lid wafer (with the oxide depicted as an under-lid feature according to the eventual encapsulation orientation) and then etched to form access paths to the TSVs and selected regions of the p-type lid. Thereafter, an ISDP layer is deposited over the oxide mask to establish contact with the TSVs and selected lid regions, and then etched to electrically isolate the TSV conduction paths. At this point, highly-doped polysilicon (ISDP) is disposed adjacent the selected regions of the p-type lid wafer so that a thermal drive cycle will diffuse n-type dopant into the lid, in effect forming an n-p-n bipolar-junction transistor (BJT) with a disproportionately large base region (i.e., implementing a reverse-bias diode between each of the TSVs and the lid and thus, series anode-to-anode-coupled diodes between the TSVs). Accordingly, any applied voltage greater than the diode breakdown voltage (plus the diode threshold voltage) will result in conduction through the series-coupled diodes, thereby limiting the potential that may develop across the TSV terminals and protecting the dual-silicon resonator (and particularly its sensitive piezoelectric layer) from excess applied voltage. From a fabrication standpoint, the ISDP deposition used for TSV contact is leveraged to create ESD protection with limited additional process change (e.g., a mere oxide mask-layer change to expose the lid wafer regions that will eventually become the BJT collector and emitter regions, and a thermal drive cycle which may be applied in either case to ensure contact between the TSVs and ISDP layer).

FIG. 11B illustrates an approach similar to that of FIG. 11A, except with n-type dopant implanted (rather than diffused) into the p-type lid region. This process facilitates reverse-order BJT fabrication in the case of an n-type lid wafer; that is, p-type dopant may be implanted to form a pnp BJT (i.e., series cathode-to-cathode coupled diodes between the TSV terminals which exhibit the same breakdown-plus-threshold turn-on potential as the npn configuration). In either of the FIG. 11A/11B embodiments, metal or silicide traces may be formed over the diffused (or implanted) collector/emitter regions to eliminate hot spots and increase efficiency of the ESD protection circuit.

FIGS. 11C, 11D and 11E illustrate exemplary implementations of ESD-protection circuits in the device silicon layer or handle layer of an SOI substrate. In the embodiment of FIG. 11C, PSG is deposited over an oxide mask and then thermally driven to create adjacent n-type diffusions, separated by a portion of the p-type device-layer silicon (i.e., an npn BJT as discussed above). ISDP contacts may be formed between the diffusion regions (collector/emitter) and respective through-lid or through-handle vias to complete the ESD-protection circuit. In the embodiment of FIG. 11D, the piezoelectric layer (AlN in the example shown) is patterned to include openings for later-deposited ISDP contact to the p-type device-layer silicon, thus enabling formation of n-type collector/emitter regions (i.e., through a thermal drive cycle as described in reference to FIG. 11A). As in the embodiment of FIG. 11C, the ISDP features (and thus the BJT) may be interconnected to TSVs in the lid and/or substrate to complete the ESD-protection circuit.

In the embodiment of FIG. 11E, a deep-trench isolation (DTI) process is used to form isolated regions in the device layer material stack after piezoelectric film deposition. A deep contact process is then used to penetrate the oxide layer of the SOI structure so that subsequent ISDP deposition (and etching) enables contact formation penetrating from the ISDP layer of the device material stack to the p-type handle wafer. As in the embodiments of FIGS. 11A and 11C, a thermal drive cycle will diffuse dopant into the p-type handle wafer to form the collector and emitter diffusions of an npn BJT and thus, upon coupling the package TSVs to the respective n-type handle-layer diffusions, an ESD-protection circuit.

FIGS. 12A and 12B illustrate exemplary electrical interconnections between encapsulation-level TSVs and piezo-actuated resonator electrodes that enable both package-level terminal interconnection (i.e., during subsequent packaging steps) and post-encapsulation joule-heating of the MEMS resonator. In the embodiment of FIG. 12A, three terminals are exposed at TSVs through the lid and/or substrate layer of the encapsulated dual-silicon resonator—two terminals coupled to opposite lateral ends of the top electrode (shown as an ISDP layer, though any of the alternative material layer configurations may be used) and one terminal coupled to the bottom electrode (a degenerately-doped single-crystal silicon layer in this example). By this arrangement, a direct or alternating current may be passed through the tethering structures of the resonator and top electrode layer, either or both of which may be designed to superheat the resonator material stack (e.g., heat the resonator material stack to temperatures ranging from, for example and without limitation, 500°-1300° Celsius) and thus carry out any number of post-encapsulation annealing operations and/or thermal frequency trim operations. The embodiment of FIG. 12B is similar to that of FIG. 12A, except that the joule-heating terminal pair is tether-coupled to opposite lateral ends of the bottom electrode layer (e.g., degenerately-doped single-crystal silicon layer) to operate the bottom tethering layer and/or bottom electrode layer as the superheating source instead of the top-layer tether/electrode elements. In yet other embodiments, two joule-heating terminal pairs may be provided, with each coupled to opposite ends of a respective degenerately-doped silicon layer. Also, as discussed in greater detail below, the joule-heating terminal pair in either of the FIG. 12A/12B embodiments may be merged to form, together with the third encapsulation terminal, the resonator sense/drive terminals discussed in reference to FIG. 1A. Alternatively, the joule-heating terminal pair may be driven by equipotential resonator-drive signals to emulate an electrical coupling of the terminal pair. That is, instead of wiring the terminals together to establish an equipotential at the lateral ends of the relevant material layer (and tethering layers), the terminals may be driven to an equipotential by a drive/sense circuit of an attached logic die.

FIG. 13A illustrates a post-encapsulation joule-heating configuration in which electrically conductive vias extend through a hermetically encapsulating lid to contact corresponding electrically conductive anchoring structures (i.e., anchors and tethering elements formed from or layered with electrically conductive material). By this arrangement, joule heating current may be driven through the top and/or bottom resonator electrode during post-encapsulation finishing operations, or even post-production, including joule-heating in the field before or after the MEMS device has been deployed within a host system. FIG. 13B illustrates an alternative embodiment in which electrically conductive vias extend through the device substrate (e.g., bulk semiconductor) to enable joule-heating current flow through either or both of the resonator electrodes. In both the FIGS. 13A and 13B embodiments, the hermetic encapsulation may, together with a perimeter seal ring or like structure, enclose a vacuum cavity or a cavity filled with inert, thermally isolating material, thus limiting thermal radiation from the resonator to the substrate and lid structures.

FIG. 14A illustrates an exemplary thermal profile achieved by conducting a DC or AC joule-heating current through a resonator structure via anchors and folded tethers. In one embodiment, conductive paths within the tethering structures are implemented with higher electrical resistivity than within the anchors and resonator electrodes so that joule heating occurs predominantly within the tethers, resulting in conductive and possibly radiant heating of the dual-silicon resonator (where joule heating may also occur). The tethers may also thermally isolate the resonator body from the ambient or near-ambient temperature ($T_0$) anchors during joule heating so that, in a vacuum environment at least, the nominal tether temperature at the tether's physical midpoint (i.e., between the anchor and resonator body) rises to $T_0+T_{JH}/2$, and the resonator body is heated relatively uniformly throughout to a temperature $T_0+T_{JH}$. Other temperature profiles (including those having nonlinear gradients) may be produced in alternative embodiments. The resonator body may be slightly cooler than the hottest part of the tethers during joule heating due to radiative dissipation or gas conduction, but will usually be near the highest temperature of the tethers. The temperature profile can be accounted for in the design and thermal frequency trim process.

FIG. 14B illustrates an alternative heating arrangement in which joule-heating is sourced primarily within a patterned electrode layer of the dual-silicon resonator. The tethers may still be structured to provide thermal isolation between the resonator and anchoring field areas, but are otherwise sufficiently conductive such that the predominant joule-heating voltage drop (and power dissipation) occurs within the patterned electrode layer. In the particular example shown, the patterned electrode (e.g. implemented in one or both of the degenerately-doped silicon layers—single-crystal silicon and/or polysilicon, with the latter arrangement depicted) includes a relatively narrow conductive passage extending between larger bulk interconnect nodes. Due to its relatively low cross-sectional area (and correspondingly higher resistance), the narrow passage constitutes the predominant source of ohmic (FR) power dissipation within the conduction path traversed by the joule-heating current and thus the predominant joule-heating source. As with the tether-based heating arrangement of FIG. 14A, the resonator may be heated relatively uniformly to a target temperature (e.g., $T_0+T_{JH}$) with limited thermal radiation from the resonator to the substrate and lid structures.

FIG. 15 illustrates an exemplary processing of packaged dual-silicon-resonator MEMS device in which an oven reflow operation is executed to merge two separate terminals that form a joule-heating port into a single operational terminal. That is, prior to oven reflow, the packaged MEMS device includes three electrically isolated terminals, two of which form a port for heating or superheating the dual-silicon resonator structure as discussed above in reference to FIGS. 12A and 12B, while the other terminal forms a first operational terminal. As respective solder layers (or layers of other heat-soluble electrically conductive material) of the two heating port terminals are rendered fluid during oven reflow and flow together, the two heating port terminals are effectively merged to form the second of two operational terminals (i.e., converting the MEMS resonator device from a three-terminal device to a two-terminal device). This same approach may be carried out with respect to the first operational terminal (e.g., reflowing to merge distinct terminals that may constitute a second heating port into the first operational terminal) or other terminals not shown.

FIGS. 16A and 16B illustrate an alternative terminal reduction approach in which three or more encapsulation-level terminals (e.g., as discussed in reference to FIGS. 12A and 12B) are merged prior to enclosure within a package housing to expose only two electrically independent package-level terminals. In the conceptual diagram of FIG. 16A, the joule-heating terminals (joule-heating port) are coupled to an ISDP layer of a dual-silicon piezo-actuated layer stack (thus permitting introduction of joule-heating current through wafer probes or singulated die probes), but may alternatively be coupled to the core single-crystal resonator layer or supplemented by an additional heating port coupled to the core resonator layer (i.e., in a four-terminal encapsulation structure).

FIG. 16B illustrates an exemplary sequence of packaging operations to yield the intra-package terminal merger (reduction) shown in FIG. 16A, showing cross-sectional and top views of the encapsulated structure or packaged structure at each point in the sequence. Starting with an exemplary three-terminal encapsulated structure, the two joule-heating terminals are merged by a metal deposition to form a unified top-electrode terminal (or bottom-electrode terminal). Thereafter, an additional packaging layer (e.g., polyimide or other non-conductive molding) is disposed over the merged electrode terminals with through-vias and solder-ball sockets formed as shown to yield a four-terminal package in which two of the package-level terminals are electrically common (per the terminal-merging metal deposition) to form top electrode interconnect nodes, and a third of the four terminals is coupled to the bottom electrode (or vice-versa). The fourth package-level terminal is provided primarily for mechanical stability and may be left unconnected ("no connect" or "NC") or redundantly coupled to the bottom or top resonator electrode. In yet other embodiments, particularly where an oblong packaging structure is desired, only two package-level contacts may be exposed—one for each of the two resonator electrodes.

Any of the various dual-silicon piezo-actuated resonators disclosed herein may be combined with additional elements to form a system with improved temperature stability and/or other useful functionality. In the embodiment of FIG. 17A, for example, a dual-silicon resonator is combined with a sustaining/sensing circuit to form an oscillator. The resonant frequency of the oscillator may be modified in a temperature-dependent manner (i.e., as shown in FIG. 3A, a temperature sensor output signal—indicative of temperature—is received within a frequency modifying element which, in turn, provides a temperature-dependent resonant-frequency control signal to the dual-silicon resonator and/or sustaining/sensing circuit) and to yield a resonant frequency with improved temperature stability compared to that achievable with the dual-silicon resonator alone. For example, a temperature-dependent time-varying electrostatic field may be applied directly to the dual-silicon piezo-actuated resonator via the top and bottom electrodes discussed above, for example, to adjust or pull the frequency of the resonator by manipulating the piezo-actuated mechanical stress on the resonator in a temperature dependent manner. Alternatively (or additionally), the capacitance of a varactor or other variable-capacitance element within the sustaining/sensing circuit may be modified in a temperature-dependent manner to tune the frequency of the oscillator system (i.e., system including dual-silicon resonator and sustaining/sensing circuit).

In an alternative embodiment, shown for example in FIG. 17B, an oscillatory signal (clock signal) generated by a dual-silicon resonator is modified within an output processing stage that includes a temperature sensor and frequency modifying element. For example, a temperature-dependent signal from a temperature sensor may be provided to a fractional-N phase locked loop (an example of a frequency modifying element) to enable generation of an output frequency more stable over a temperature range of interest than the raw resonator output signal.

In a number of embodiments, a temperature sensor as shown in FIGS. 17A and 17B may be implemented within one or more component members of an encapsulated dual silicon resonator, or within a multi-die package that includes a dual-silicon resonator (MEMS) die and logic die. FIG. 18 illustrates various options for such temperature-sensor integration, including temperature sensor implementation within the lid or device layer of an encapsulated dual-silicon resonator and/or within a collocated logic die that additionally contains the sustaining/sensing circuit for driving the dual-silicon resonator into one or more resonant oscillation modes and sensing the resonant mechanical motion of the resonator. In the case of in situ disposition within the device layer of an encapsulated resonator structure, the temperature sensor may be implemented by a secondary micromachined structure, and more specifically by a micromachined (or MEMS) thermistor structure that is substantially released from the device-layer substrate and having any number of shapes that permit relatively stress/strain-free thermal expansion and contraction (and thus limited mechanically-induced nonlinearity in the temperature dependence of the end-to-end thermistor resistance). Though not specifically shown, the end-terminals of the MEMS thermistor may be coupled to TSVs in the encapsulation structure (lid and/or substrate) and ultimately to package level contacts to enable a temperature-sense output signal. When implemented in the lid wafer or logic die, the temperature sensor may be implemented by a silicon, polysilicon or metal thermistor feature, p-n junction and/or other thermally-sensitive feature. In yet other embodiments, discussed in greater detail below, the temperature sensor may be implemented by a patterned trace and/or p-n junction within one or more layers of the dual-silicon resonator itself.

FIG. 19 illustrates an exemplary process for fabricating a MEMS thermistor and dual-silicon MEMS resonator (having two degenerately-doped silicon layers and a piezoelectric layer as discussed above) within neighboring regions of the same SOI substrate (i.e., to be resident within the same encapsulated device layer). As shown, an oxide layer is deposited over an SOI substrate and then etched (e.g., wet-etched) to yield a masked thermistor region. After PSG deposition (e.g., via vapor-phase POCl$_3$) and a mini drive cycle (relatively short duration drive) to achieve a relatively shallow dopant diffusion, and then a long anneal (relatively long and/or high-temperature drive) to achieve a deeper final dopant diffusion profile. At this point the single-crystal silicon device layer is degenerately doped (with process-dependent gradient) except in a thermistor region beneath the oxide mask, which remains relatively undoped. Remaining layers of the dual-silicon resonator are deposited (e.g., AN and ISDP or any other materials according to variants discussed above), the oxide mask is removed and trenching/etching and release processes are carried out to finalize the two collocated MEMS elements—dual-silicon resonator and neighboring MEMS thermistor. By juxtaposing the MEMS thermistor and dual-silicon resonator within the same device layer, and within the same (eventually) encapsulated chamber and singulated die (e.g., within practicable lineal separation of each other), temperature gradients between the thermistor and resonator that plague less proximal temperature-sense/resonator arrangements are eliminated (or rendered negligible), increasing accuracy of the various temperature-compensation schemes shown in FIGS. 17A and 17B.

FIG. 20 illustrates an exemplary interconnect arrangement within a dual-silicon resonator having an additional lightly-doped (or undoped) single-crystal silicon thermistor layer as part of the resonator structure. While this arrangement adds a layer to the resonator material stack (in this case with the thermistor layer disposed beneath the dual degenerately-doped silicon layers and piezo layer described above—any other stack location may be feasible), the thermal coupling of the thermistor layer to the remainder of the resonator material stack ensures zero or near-zero temperature differential between those two resonator regions, again, avoiding error-inducing temperature gradients suffered by less proximal arrangements. As shown, an additional pair of sense terminals may be coupled across the thermistor layer (e.g., through conductive structures in the tethering/anchoring structures to opposite lateral ends of the thermistor layer) and routed to external contacts of the encapsulated material stack and eventual resonator/thermistor package.

FIG. 21 illustrates an alternative temperature-sensing arrangement in which an additional temperature-sensitive resonator, "R1" (instead of or in addition to a thermistor), is provided (and implemented, for example, within the same device layer and encapsulation) together with logic circuitry for ascertaining an output frequency difference between the temperature-sensitive resonator and the relatively temperature-insensitive ("temperature-flat") dual-silicon resonator, "R2." By mapping the frequency difference between the two resonators to a temperature differential, an extremely precise and resolute temperature measurement may be obtained and used, as shown in FIGS. 17A and 17B, to yield a tempera-ture-corrected resonator output signal. As with the thermistor-based temperature sensor embodiments of FIGS. 19 and 20, collocation of the two disparate-TCF resonators within the same device layer (and eventual encapsulation and singulated die) avoids error-inducing temperature gradients between the two structures.

FIG. 22 illustrates an alternative temperature-sensing approach in which two simultaneous and disparate temperature-dependent resonance modes within a singular dual-silicon resonator are exploited to yield a temperature measurement (i.e., by mapping the frequency difference between the resonator modes to a temperature differential) and thus a temperature-corrected resonator output signal.

The various MEMS systems, devices, structures, components disclosed herein, as well as related circuitry (e.g., sustaining circuitry, sense circuitry, drive circuitry, conditioning circuitry, control circuitry, etc.) may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such structure and/or circuit expressions may be implemented include, but are not limited to, formats supporting behavioral languages such as C, Verilog, VHDL, and Matlab, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computing system via one or more computer-readable media, such data and/or instruction-based expressions of the above described structures, circuits and/or circuitry may be processed by a processing entity (e.g., one or more processors) of the computing system in conjunction with execution of one or more other computer programs including, without limitation, net-list generation programs, place and route programs and the like, to generate a representation or image of a physical manifestation of such structures, circuits and/or circuitry. Such representation or image may thereafter be used in device fabrication, for example, by enabling generation of one or more masks that are used to form various device/circuit components, features or structures in a device fabrication process.

Moreover, the various structures (for example, the structures of the MEMS device), circuits and/or circuitry disclosed herein may be represented via simulations using computer aided design and/or testing tools. The simulation of the various structures and/or characteristics or operations thereof may be implemented by a computing system wherein characteristics and operations of such structures and/or circuitry, and techniques implemented thereby, are imitated, replicated and/or predicted via a computer system. The disclosed embodiments encompass such simulations of the exemplary structures and circuitry disclosed herein, and/or techniques implemented thereby.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of signaling or operating frequencies, component circuits or devices, numbers and/or arrangement of structural layers, material types, dopant types and concentrations and the like can be different from those described above in alternative embodiments. Additionally, links or other interconnection between integrated circuit devices or internal circuit elements, structural elements or blocks may be shown as buses or as single signal lines. Each of the buses can alternatively be a single signal line, and each of the single signal lines can alternatively be buses. The term "coupled" is used herein to express a direct connection as well as a connection through one or more intervening circuits or structures. Device "programming" or "configuration" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of fabricating a microelectromechanical system (MEMS) resonant structure, the method comprising:
    forming a silicon-on-insulator structure having an insulating material layer disposed between a first degenerately-doped silicon layer and a substrate layer;
    epitaxially growing an aluminum nitride material layer on the first degenerately-doped silicon layer;
    forming a second degenerately-doped silicon layer on the aluminum nitride material layer such that the aluminum nitride material layer is sandwiched between the first and second degenerately-doped silicon layers; and
    removing at least a portion of the insulating material layer from beneath the first degenerately-doped silicon layer;
    wherein the first degenerately-doped silicon layer is to serve as a first electrode for the MEMS resonant structure and the second degenerately-doped silicon layer is to serve as a second electrode for the MEMS resonant structure, each in absence of a metal electrode layer.

2. The method of claim 1 wherein forming the silicon-on-insulator structure having the insulating material layer disposed between the first degenerately-doped silicon layer and the substrate layer comprises separating the first degenerately-doped silicon layer from a degenerately-doped silicon ingot and disposing the first degenerately-doped silicon layer on the insulating material layer.

3. The method of claim 1 wherein forming the silicon-on-insulator structure having the insulating material layer disposed between the first degenerately-doped silicon layer and the substrate layer comprises epitaxially forming the first degenerately-doped silicon layer on the insulating material layer within a chamber populated by vapor phase silicon and a vapor phase dopant.

4. The method of claim 1 wherein forming the silicon-on-insulator structure having the insulating material layer disposed between the first degenerately-doped silicon layer and the substrate layer comprises forming the first degenerately-doped silicon layer by thermally diffusing a solid-phase dopant into a non-degenerately-doped silicon layer.

5. The method of claim 1 wherein forming the silicon-on-insulator structure having the insulating material layer disposed between the first degenerately-doped silicon layer and the substrate layer comprises forming the first degenerately-doped silicon layer by diffusing at least one of a vapor-phase dopant or a liquid-phase dopant into a non-degenerately-doped silicon layer.

6. The method of claim 1 wherein forming the silicon-on-insulator structure having the insulating material layer disposed between the first degenerately-doped silicon layer and the substrate layer comprises disposing the insulating material layer between the substrate layer and a single-crystal silicon layer having a dopant concentration of at least $10^{20}$ dopant atoms per cubic centimeter.

7. The method of claim 1 wherein the first degenerately-doped silicon layer, aluminum nitride material layer and second degenerately-doped silicon layer collectively constitute a material stack, the method further comprising etching the material stack to distinguish a moveable portion of the MEMS resonant structure from a field area.

8. The method of claim 7 wherein removing at least the portion of the insulating material layer from beneath the first degenerately-doped silicon layer comprises removing the portion of the insulating material layer after etching the material stack.

9. The method of claim 1 wherein the substrate layer comprises a single-crystal silicon layer.

10. The method of claim 1 wherein forming the silicon-on-insulator structure having the insulating material layer disposed between the first degenerately-doped silicon layer and the substrate layer comprises forming the first degenerately-doped silicon layer by ion-implantation of dopant into a non-degenerately-doped silicon layer.

11. The method of claim 1 wherein the first degenerately-doped silicon layer comprises a degenerately-doped single-crystal silicon layer.

12. The method of claim 11 wherein the second degenerately-doped silicon layer comprises a degenerately-doped polycrystalline silicon layer.

13. The method of claim 12 wherein the degenerately-doped polycrystalline silicon layer comprises in-situ-doped polycrystalline silicon.

14. The method of claim 11 wherein the method further comprises forming the MEMS resonant structure to have a predetermined angular deviation between a crystallographic orientation of the degenerately-doped single-crystal silicon layer and a resonance mode orientation of the MEMS resonant structure.

15. The method of claim 11 wherein the method further comprises forming at least one of the degenerately-doped single-crystal silicon layer and the aluminum nitride material layer, such that the degenerately-doped single-crystal silicon layer and the aluminum nitride material layer have respective, reciprocal-polarity parabolic temperature coefficients of frequency.

16. The method of claim 11 wherein the method further comprises forming the degenerately-doped single-crystal silicon layer by doping single-crystal silicon with at least one of phosphorus, arsenic, antimony, bismuth and lithium.

17. The method of claim 11 wherein the method further comprises forming the MEMS resonant structure so as to be encapsulated within a hermetically sealed chamber.

18. A method of fabricating a microelectromechanical system (MEMS) resonant structure, the method comprising:
    forming a silicon-on-insulator structure having an insulating material layer disposed between a first degenerately-doped silicon layer and a substrate layer;
    epitaxially growing an aluminum nitride material layer on the first degenerately-doped silicon layer;
    forming a second degenerately-doped silicon layer on the aluminum nitride material layer such that the aluminum nitride material layer is sandwiched between the first and second degenerately-doped silicon layers; and
    removing at least a portion of the insulating material layer from beneath the first degenerately-doped silicon layer;
    wherein the first degenerately-doped silicon layer is to serve as a first electrode for the MEMS resonant structure and the second degenerately-doped silicon layer is to serve as a second electrode for the MEMS resonant structure, each in absence of a metal electrode layer; and
    wherein the method further comprises forming the MEMS resonant structure such that the aluminum nitride material layer and one of the first or second degenerately-doped silicon layers, respectively, have reciprocal-polarity parabolic temperature coefficients of frequency.

19. The method of claim 18 wherein the method further comprises forming the MEMS resonant structure to have a predetermined angular deviation between a crystallographic orientation of one of first or second the degenerately-doped silicon layers and a resonance mode orientation of the MEMS resonant structure.

20. A method of fabricating a microelectromechanical system (MEMS) resonant structure, the method comprising:
    forming a silicon-on-insulator structure having an insulating material layer disposed between a first degenerately-doped silicon layer and a substrate layer, the first degenerately-doped silicon layer comprising a first one of polysilicon and single-crystal silicon;
    epitaxially growing an aluminum nitride material layer on the first degenerately-doped silicon layer;
    forming a second degenerately-doped silicon layer on the aluminum nitride material layer such that the aluminum nitride material layer is sandwiched between the first and second degenerately-doped silicon layers, the second degenerately-doped silicon layer comprising a second one of polysilicon and single-crystal silicon; and
    removing at least a portion of the insulating material layer from beneath the first degenerately-doped silicon layer;
    wherein the first degenerately-doped silicon layer is to serve as a first electrode for the MEMS resonant structure and the second degenerately-doped silicon layer is to serve as a second electrode for the MEMS resonant structure, each in absence of a metal electrode layer; and
    wherein the method further comprises forming the MEMS resonant structure such that at least one of the first degenerately-doped silicon layer and the second degenerately-doped silicon layer comprises single-crystal silicon, and such that the single-crystal silicon has a predetermined angular deviation between a crystallographic orientation of the single-crystal silicon and a resonance mode orientation of the MEMS resonant structure.

21. The method of claim 20 wherein the method further comprises forming the MEMS resonant structure such that the single-crystal silicon and the aluminum nitride material layer, respectively, have reciprocal-polarity parabolic temperature coefficients of frequency.

22. The method of claim 20 wherein the method further comprises forming at least one predetermined layer of the MEMS resonant structure so as to have a non-uniform dopant profile.

\* \* \* \* \*